(12) United States Patent
Mikawa et al.

(10) Patent No.: US 6,750,492 B2
(45) Date of Patent: Jun. 15, 2004

(54) SEMICONDUCTOR MEMORY WITH HYDROGEN BARRIER

(75) Inventors: Takumi Mikawa, Kyoto (JP); Toshie Kutsunai, Kusatsu (JP); Yuji Judai, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/053,693

(22) Filed: Jan. 24, 2002

(65) Prior Publication Data
US 2003/0042522 A1 Mar. 6, 2003

(30) Foreign Application Priority Data
Aug. 28, 2001 (JP) ........................................ 2001-257532

(51) Int. Cl.[7] ............................................... H01L 29/76
(52) U.S. Cl. ........................ 257/295; 257/296; 438/386; 438/238
(58) Field of Search .......................... 257/295, 296; 438/210, 238, 239, 386, 399

(56) References Cited

U.S. PATENT DOCUMENTS

| 6,188,098 B1 | 2/2001 | Amanuma | |
| 6,249,014 B1 * | 6/2001 | Bailey | 257/295 |
| 6,455,882 B1 * | 9/2002 | Nakura | 257/295 |

* cited by examiner

Primary Examiner—Nathan J. Flynn
Assistant Examiner—Scott R. Wilson
(74) Attorney, Agent, or Firm—McDermott, Will & Emery

(57) ABSTRACT

A semiconductor memory device of the present invention includes: a semiconductor substrate; a memory cell capacitor for storing data, including a first electrode provided above the semiconductor substrate, a capacitance insulating film formed on the first electrode, and a second electrode provided on the capacitance insulating film; a step reducing film covering an upper surface and a side surface of the memory cell capacitor; and an overlying hydrogen barrier film covering the step reducing film.

13 Claims, 15 Drawing Sheets

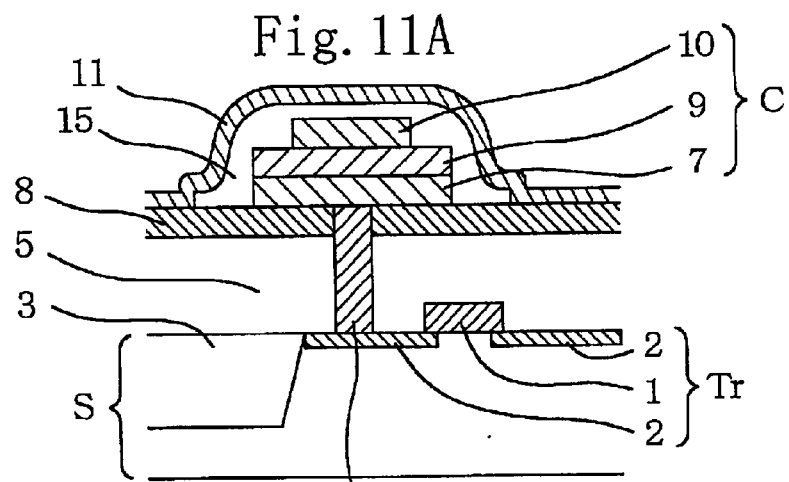
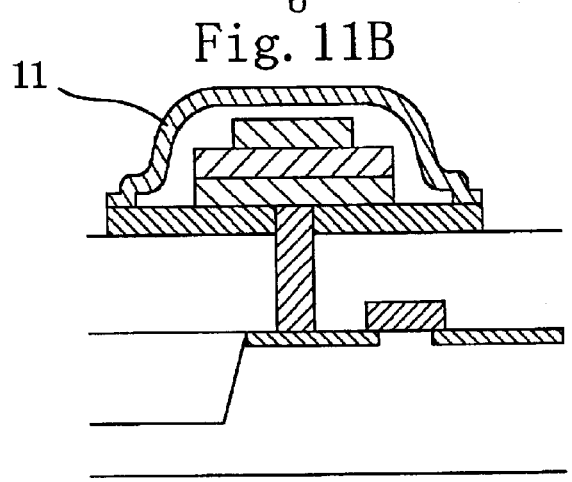
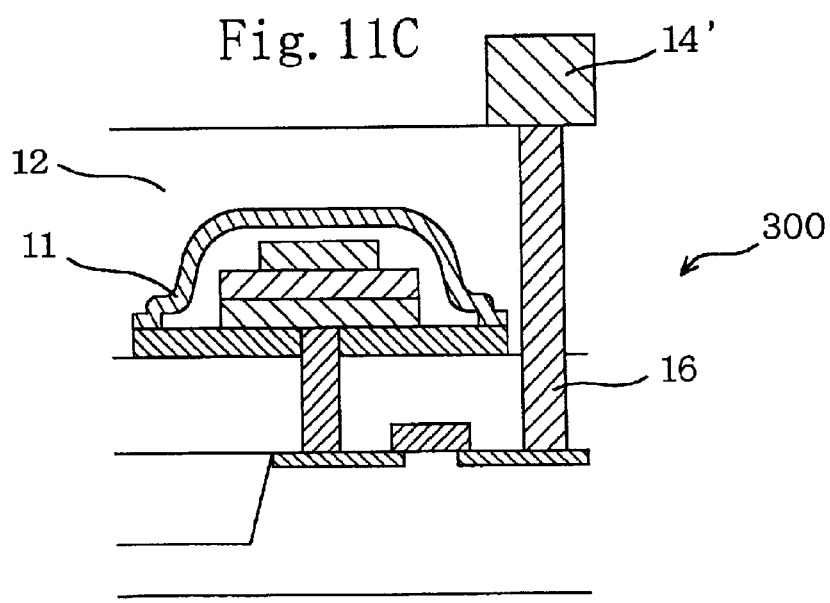

SEMICONDUCTOR MEMORY WITH HYDROGEN BARRIER

BACKGROUND OF THE INVENTION

The present invention relates to a semiconductor memory device and a method for manufacturing the same, and more particularly to improving the reliability of a semiconductor memory device.

In recent years, a ferroelectric memory device has been developed in the art in which the memory cell capacitor uses, in its capacitance insulating film, a ferroelectric material having hysteresis characteristics such as $Pb(Zr,Ti)O_3$, $SrBi_2Ta_2O_9$, or the like.

In order to realize a ferroelectric memory device, it is most important to develop a structure, and a method for manufacturing the same, with which memory cell capacitors can be integrated together without deteriorating the characteristics thereof. Particularly, a ferroelectric material used in a capacitance insulating film is a laminar oxide containing oxygen atoms therein, and is easily reduced in a hydrogen atmosphere used in subsequent manufacturing steps after forming the memory cell capacitors, thereby deteriorating the ferroelectric characteristics thereof.

For example, along with the miniaturization of semiconductor devices, a tungsten (W) deposition process by a CVD method has been widely employed for filling a contact hole having a large aspect ratio. The W deposition process is based on the reaction represented by Formula 1 below:

$$2WF_6 + 3SiH_4 \rightarrow 2W + 3SiF_4 + 6H_2 \quad (1)$$

The reaction represented by Formula 1 above is performed in a very strong reducing atmosphere. Moreover, after the Al line formation, an annealing step is performed in a hydrogen-containing atmosphere in order to ensure the MOS transistor characteristics. The semiconductor device manufacturing process includes many other steps that generate, or use, hydrogen.

Hydrogen permeates through most of the materials used in a semiconductor device. Therefore, conventional ferroelectric memory devices have taken measures to prevent deterioration of the characteristics of memory cell capacitors during the manufacturing process, for example, by reducing the hydrogen generation or suppressing the reducing atmosphere in subsequent manufacturing steps after forming the memory cell capacitors, or by covering the memory cell capacitors with an insulative hydrogen barrier film. A conventional method for suppressing/preventing deterioration of the characteristics of memory cell capacitors during the manufacturing process by using a hydrogen barrier film will now be described as an example.

FIG. 16 is a cross-sectional view illustrating a first conventional memory cell 1000 designed so as to suppress/prevent deterioration of the characteristics of the memory cell capacitors during the manufacturing process.

The memory cell 1000 includes a MOS transistor Tr used as a memory cell transistor, and a memory cell capacitor C. The MOS transistor Tr includes a gate electrode 1 formed on a semiconductor substrate S, and high concentration impurity diffusion regions 2. The MOS transistor Tr of a memory cell is electrically isolated from the MOS transistor Tr of another adjacent memory cell by a shallow trench isolation region (hereinafter referred to simply as "STI region") 3. A word line (not shown) is connected to the gate electrode 1, and a bit line 4 is connected to one of the high concentration impurity diffusion regions 2. A first insulative film 5 and a first hydrogen barrier film 8 are formed on the semiconductor substrate S with the MOS transistor Tr formed thereon.

The memory cell capacitor C includes a lower electrode 7 formed on the first hydrogen barrier film 8, a capacitance insulating film 9 made of a ferroelectric material and formed on the lower electrode 7, and an upper electrode 10 formed on the capacitance insulating film 9. The lower electrode 7 is connected to the other one of the high concentration impurity diffusion regions 2 via a contact plug 6 running through the first insulative film 5 and the first hydrogen barrier film 8.

A second hydrogen barrier film 11 is formed on the first hydrogen barrier film 8 and the memory cell capacitor C so as to cover the memory cell capacitor C, and a second insulative film 12 is formed on the second hydrogen barrier film 11. The upper electrode 10 is connected to an Al line 14 via a contact plug 13 running through the second hydrogen barrier film 11 and the second insulative film 12.

FIG. 17 is a cross-sectional view illustrating a second conventional memory cell 1100 designed so as to prevent deterioration of the characteristics of the memory cell capacitors during the manufacturing process.

The memory cell 1100 illustrated in FIG. 17 has substantially the same structure as that of the first conventional memory cell 1000 illustrated in FIG. 16. However, the memory cell 1100 is different from the first conventional memory cell 1000 in that the second hydrogen barrier film 11 is formed over the second insulative film 12.

A CVD method or a sputtering method is typically used for depositing a hydrogen barrier film. However, a gas used in a CVD method often contains hydrogen and thus generates hydrogen or water during the deposition step, thereby deteriorating the capacitance insulating film, which is made of a ferroelectric material. In view of this, in the manufacturing process of such a conventional memory cell as described above, the second hydrogen barrier film 11, which is formed in a step after the formation of the memory cell capacitor C, is formed by a sputtering method, which does not generate hydrogen during the deposition step, using a material such as $Al_2O_3$ or TiN, for example.

However, in the first conventional memory cell 1000 illustrated in FIG. 16, the step coverage of the second hydrogen barrier film 11 is poor at an edge portion E of the memory cell capacitor C, as illustrated in FIG. 18. This adversely influences the crystallinity/packing of the second hydrogen barrier film 11 at the edge portion E, thereby resulting in grain boundaries. Hydrogen having passed through the second insulative film 12 of the memory cell 1000 may intrude into the memory cell capacitor C through such grain boundaries. Such hydrogen deteriorates the capacitance insulating film 9, which is made of a ferroelectric material.

In the second conventional memory cell 1100 illustrated in FIG. 17, when forming the contact plug 13 for connecting the Al line 14 and the upper electrode 10 to each other, hydrogen may intrude into the second insulative film 12 through the side wall of the connection hole in which the contact plug 13 is being formed. The hydrogen diffuses through the second insulative film 12 to reach and deteriorate the capacitance insulating film 9, which is made of a ferroelectric material.

As described above, it is very difficult in the conventional memory cells to suppress/prevent deterioration of the capacitance insulating film, which is made of a ferroelectric material.

SUMMARY OF THE INVENTION

The present invention has been made to solve these problems in the prior art, and has an object to provide a semiconductor device including a reliable memory cell capacitor in which deterioration of the characteristics of the memory cell capacitor due to hydrogen or a reducing atmosphere is suppressed/prevented.

A semiconductor memory device of the present invention includes: a semiconductor substrate; a memory cell capacitor for storing data, including a first electrode provided above the semiconductor substrate, a capacitance insulating film formed on the first electrode, and a second electrode provided on the capacitance insulating film; a step reducing film covering an upper surface and a side surface of the memory cell capacitor; and an overlying hydrogen barrier film covering the step reducing film.

According to the present invention, the step reducing film for reducing the step at the edge portion of the memory cell capacitor is formed so as to cover the memory cell capacitor. Thus, the step coverage of the overlying hydrogen barrier film is improved. Therefore, the crystallinity/packing of the overlying hydrogen barrier film formed on the step reducing film is maintained at the edge portion, as compared to a conventional memory cell. In this way, deterioration of the characteristics of the capacitance insulating film of the memory cell capacitor due to intrusion and diffusion of hydrogen through the edge portion is suppressed/prevented.

Preferably, the step reducing film is formed by an atmospheric pressure thermal CVD method using $O_3$ and TEOS.

With an atmospheric pressure thermal CVD method using $O_3$ and TEOS, the temperature in the film formation step is low while substantially no hydrogen is generated. Therefore, it is possible to form the step reducing film without damaging the capacitance insulating film. Moreover, if the step reducing film is formed by an atmospheric pressure thermal CVD method using $O_3$ and TEOS, the surface of the step reducing film naturally becomes smooth. Thus, the smooth surface of the step reducing film can be formed very easily.

Preferably, the overlying hydrogen barrier film is formed by a sputtering method.

Since a sputtering method generates no hydrogen, it is possible to suppress/prevent deterioration of the characteristics of the capacitance insulating film of the memory cell capacitor due to hydrogen.

Preferably, the semiconductor memory device further includes an underlying hydrogen barrier film provided under the first electrode.

In this way, it is possible to suppress/prevent deterioration of the characteristics of the capacitance insulating film of the memory cell capacitor due to intrusion and diffusion of hydrogen from the semiconductor substrate side.

Preferably, the underlying hydrogen barrier film is in contact with the overlying hydrogen barrier film in a peripheral region around the memory cell capacitor.

In this way, the memory cell capacitor is completely enclosed by the underlying hydrogen barrier film and the overlying hydrogen barrier film, thereby improving the effect of suppressing/preventing deterioration of the characteristics of the capacitance insulating film due to hydrogen.

Preferably, the overlying hydrogen barrier film and the underlying hydrogen barrier film are patterned so as to have substantially the same outer shape.

Where a contact plug is provided in a region where the overlying hydrogen barrier film and the underlying hydrogen barrier film are not formed, it is possible to suppress/prevent deterioration of the shape of the contact plug, which may occur when the contact plug runs through these two films.

The overlying hydrogen barrier film may include a barrier film covering an upper surface of the step reducing film and a side wall covering a side surface of the step reducing film.

Preferably, the first electrode is buried in the underlying hydrogen barrier film.

In this way, it is possible to reduce the height of the memory cell capacitor from the surface of the underlying hydrogen barrier film by the thickness of the first electrode. Thus, the step in the overlying hydrogen barrier film is reduced. Therefore, it is possible to suppress the influence of the thickness of the resist film used when patterning the overlying hydrogen barrier film on the patterning process, thereby further miniaturizing the memory cell.

Preferably, the first electrode includes a conductive hydrogen barrier film in a lower portion thereof.

In this way, it is possible to suppress/prevent deterioration of the characteristics of the capacitance insulating film due to a very slight amount of hydrogen that is diffused from, for example, the contact plug connected to the first electrode.

A method for manufacturing a semiconductor memory device of the present invention includes the steps of: (a) forming a memory cell capacitor above a semiconductor substrate, the memory cell capacitor including a first electrode, a capacitance insulating film formed on the first electrode, and a second electrode provided on the capacitance insulating film; (b) after the step (a), forming a step reducing film on the substrate so as to cover the memory cell capacitor; and (c) forming an overlying hydrogen barrier film on the substrate so as to cover the step reducing film.

According to the present invention, the step reducing film for reducing the step at the edge portion of the memory cell capacitor is formed so as to cover the memory cell capacitor. Thus, the step coverage of the overlying hydrogen barrier film is improved. Therefore, the crystallinity/packing of the overlying hydrogen barrier film formed on the step reducing film is maintained at the edge portion, as compared to a conventional memory cell. In this way, it is possible to obtain a reliable semiconductor memory device in which deterioration of the characteristics of the capacitance insulating film of the memory cell capacitor due to intrusion and diffusion of hydrogen through the edge portion is suppressed/prevented.

Preferably, the method further includes the step of: (d) before the step (a), forming an underlying hydrogen barrier film above the semiconductor substrate, wherein in the step (a), the first electrode is formed on the underlying hydrogen barrier film.

In this way, it is possible to suppress/prevent deterioration of the characteristics of the capacitance insulating film of the memory cell capacitor due to intrusion and diffusion of hydrogen from the semiconductor substrate side.

Preferably, the method further includes the step of: (e) after the step (b), removing the step reducing film in a peripheral region around the memory cell capacitor, wherein in the step (c), the overlying hydrogen barrier film is formed so as to be in contact with the underlying hydrogen barrier film in the peripheral region around the memory cell capacitor.

In this way, a portion of the underlying hydrogen barrier film contacts the overlying hydrogen barrier film in the peripheral region around the memory cell capacitor. Therefore, the memory cell capacitor is completely enclosed by the underlying hydrogen barrier film and the overlying hydrogen barrier film, thereby improving the effect of suppressing/preventing deterioration of the characteristics of the capacitance insulating film due to hydrogen.

A wet etching method may be employed in the step (e).

Preferably, the method further includes the step of: (f) after the step (e), patterning the overlying hydrogen barrier film and the underlying hydrogen barrier film in the peripheral region around the memory cell capacitor by using the same mask.

Where a contact plug is provided in a region where the overlying hydrogen barrier film and the underlying hydrogen barrier film are not formed, it is possible to suppress/prevent deterioration of the shape of the contact plug, which may occur when the contact plug runs through these two films.

The method may further include the steps of: (g) after the step (e), removing the step reducing film and the overlying hydrogen barrier film in the peripheral region around the memory cell capacitor so as to expose the underlying hydrogen barrier film; (h) forming a second overlying hydrogen barrier film on the substrate; and (i) etching back the second overlying hydrogen barrier film so as to form a side wall covering a side surface of the overlying hydrogen barrier film and a side surface of the step reducing film.

Preferably, in the step (b), the step reducing film is formed by an atmospheric pressure thermal CVD method using $O_3$ and TEOS.

With an atmospheric pressure thermal CVD method using $O_3$ and TEOS, the temperature in the film formation step is low while substantially no hydrogen is generated. Therefore, it is possible to form the step reducing film without damaging the capacitance insulating film. Moreover, if the step reducing film is formed by an atmospheric pressure thermal CVD method using $O_3$ and TEOS, the surface of the step reducing film naturally becomes smooth. Thus, the smooth surface of the step reducing film can be formed very easily.

Preferably, in the step (c), the overlying hydrogen barrier film is formed by a sputtering method.

Since a sputtering method generates no hydrogen, it is possible to suppress/prevent deterioration of the characteristics of the capacitance insulating film of the memory cell capacitor due to hydrogen.

Another method for manufacturing a semiconductor memory device of the present invention includes the steps of: (a) forming a first electrode on a semiconductor substrate; (b) after the step (a), forming an underlying hydrogen barrier film on the substrate; (c) removing the underlying hydrogen barrier film until a surface of the first electrode is exposed so as to have the first electrode buried in the underlying hydrogen barrier film; (d) forming a capacitance insulating film on the first electrode; (e) forming a second electrode film on the capacitance insulating film; (f) patterning the capacitance insulating film and the second electrode film so as to form a memory cell capacitor; (g) after the step (f), forming a step reducing film on the substrate so as to cover the memory cell capacitor; and (h) forming an overlying hydrogen barrier film on the substrate so as to cover the step reducing film.

With this method for manufacturing a semiconductor memory device of the present invention, it is possible to reduce the height of the memory cell capacitor from the surface of the underlying hydrogen barrier film by the thickness of the first electrode. Thus, the step in the overlying hydrogen barrier film is reduced. Therefore, it is possible to suppress the influence of the thickness of the resist film used when patterning the overlying hydrogen barrier film on the patterning process, thereby further miniaturizing the memory cell.

Preferably, the method further includes the step of: (i) after the step (g), removing the step reducing film in a peripheral region around the memory cell capacitor, wherein in the step (h), the overlying hydrogen barrier film is formed so as to be in contact with the underlying hydrogen barrier film in the peripheral region around the memory cell capacitor.

In this way, a portion of the underlying hydrogen barrier film contacts the overlying hydrogen barrier film in the peripheral region around the memory cell capacitor. Therefore, the memory cell capacitor is completely enclosed by the underlying hydrogen barrier film and the overlying hydrogen barrier film, thereby improving the effect of suppressing/preventing deterioration of the characteristics of the capacitance insulating film due to hydrogen.

Preferably, in the step (g), the step reducing film is formed by an atmospheric pressure thermal CVD method using $O_3$ and TEOS.

Preferably, in the step (h), the overlying hydrogen barrier film is formed by a sputtering method.

BRIEF DESCRIPTION OF THE DRAWINGS

FIG. 11A, FIG. 11B and FIG. 11c are cross-sectional views illustrating a method for manufacturing a memory cell of Embodiment 3.

FIG. 16 is an enlarged view illustrating an edge portion E of a memory cell capacitor provided in a conventional memory cell.

DESCRIPTION OF THE PREFERRED EMBODIMENTS

Figure 1:
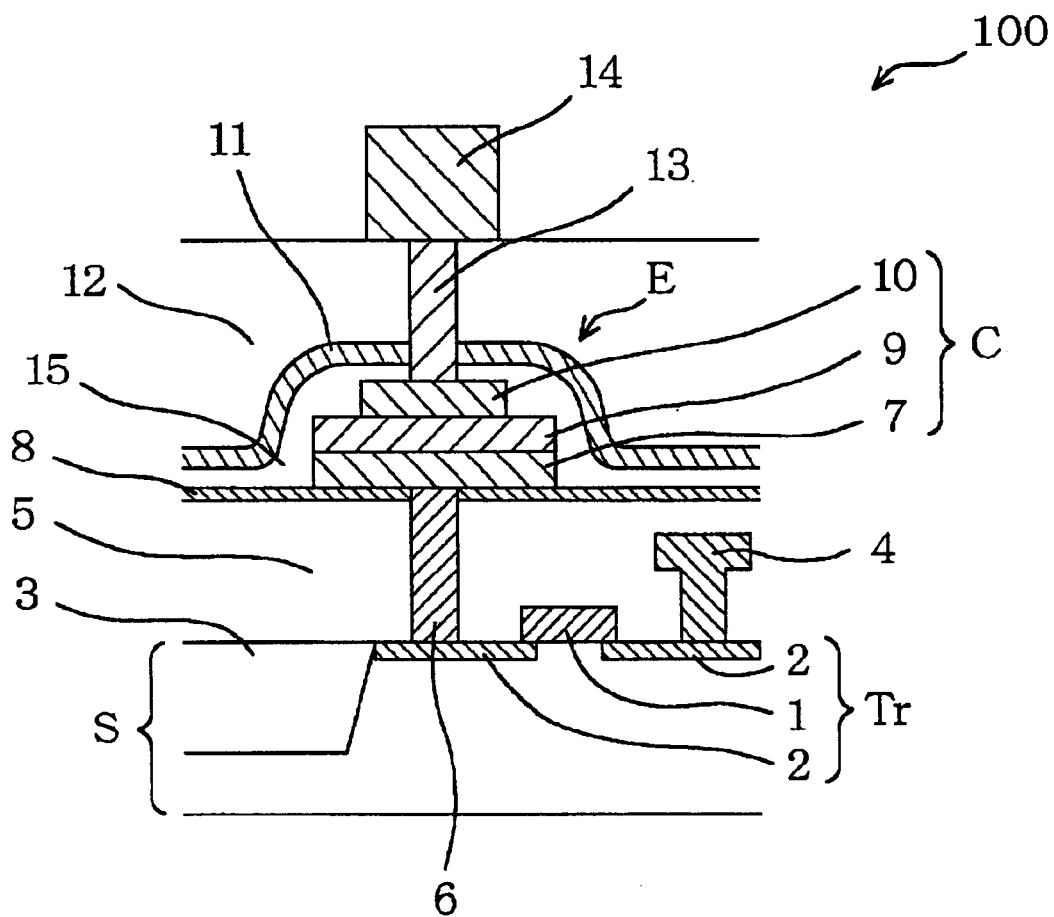
FIG. 1 is a cross-sectional view illustrating a memory cell including a memory cell capacitor of embodiment 1.

Various embodiments of the present invention will now be described with reference to FIG. 1 to FIG. 15B. For the sake of simplicity, like reference numerals denote like elements throughout the figures.

Embodiment 1

Figure 2:
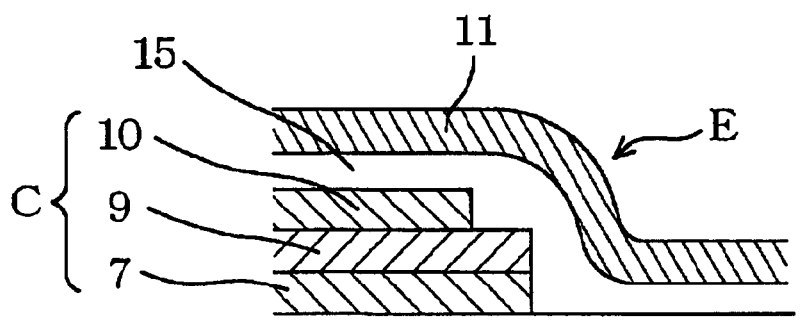
FIG. 2 is an enlarged view illustrating an edge portion E of the memory cell capacitor of the memory cell of Embodiment 1.

FIG. 1 is a cross-sectional view illustrating a memory cell 100 including a memory cell capacitor of the present embodiment. FIG. 2 is an enlarged view illustrating an edge portion E of the memory cell capacitor provided in the memory cell 100 of the present embodiment.

As illustrated in FIG. 1, the memory cell 100 of the present embodiment includes a MOS transistor Tr used as a memory cell transistor, and a memory cell capacitor C.

The MOS transistor Tr includes a gate insulating film (not shown) formed on a semiconductor substrate S, a gate electrode 1 formed on the gate insulating film, and high concentration impurity diffusion regions 2 formed on the semiconductor substrate S so as to interpose the gate electrode 1 on the semiconductor substrate S. The MOS transistor Tr of a memory cell is electrically isolated from the MOS transistor Tr of another adjacent memory cell by an STI region 3. A word line (not shown) is connected to the gate electrode 1, and a bit line 4 is connected to one of the high concentration impurity diffusion regions 2. A first insulative film 5 and a first hydrogen barrier film 8 are formed on the semiconductor substrate S with the MOS transistor Tr formed thereon. The first hydrogen barrier film 8 is provided for suppressing/preventing intrusion and diffusion of hydrogen therethrough from the semiconductor substrate S side.

The memory cell capacitor C includes a lower electrode 7 formed on the first hydrogen barrier film 8, a capacitance insulating film 9 made of a ferroelectric material and formed on the lower electrode 7, and an upper electrode 10 formed on the capacitance insulating film 9. The lower electrode 7 is connected to the other one of the high concentration impurity diffusion regions 2 via a contact plug 6 running through the first insulative film 5 and the first hydrogen barrier film 8.

An interlayer film 15 is formed on the first hydrogen barrier film 8 and the memory cell capacitor C so as to cover the memory cell capacitor C. The interlayer film 15 reduces the step at the edge portion E of the memory cell capacitor C, as illustrated in FIG. 2. A second hydrogen barrier film 11 is formed on the interlayer film 15, and a second insulative film 12 is formed on the second hydrogen barrier film 11. The upper electrode 10 is connected to an Al line 14 via a contact plug 13 running through the second hydrogen barrier film 11 and the second insulative film 12.

In the present embodiment, the interlayer film 15 for reducing the step at the edge portion E of the memory cell capacitor C is formed on the first hydrogen barrier film 8 and the memory cell capacitor C so as to cover the memory cell capacitor C, as illustrated in FIG. 1. Thus, the step coverage of the second hydrogen barrier film 11 is improved. Therefore, the crystallinity/packing of the second hydrogen barrier film 11 formed on the interlayer film 15 is maintained at the edge portion E, as illustrated in FIG. 2, as compared to the conventional memory cell 1000. The effects of this structure will be further described with reference to FIG. 3.

Figure 3:
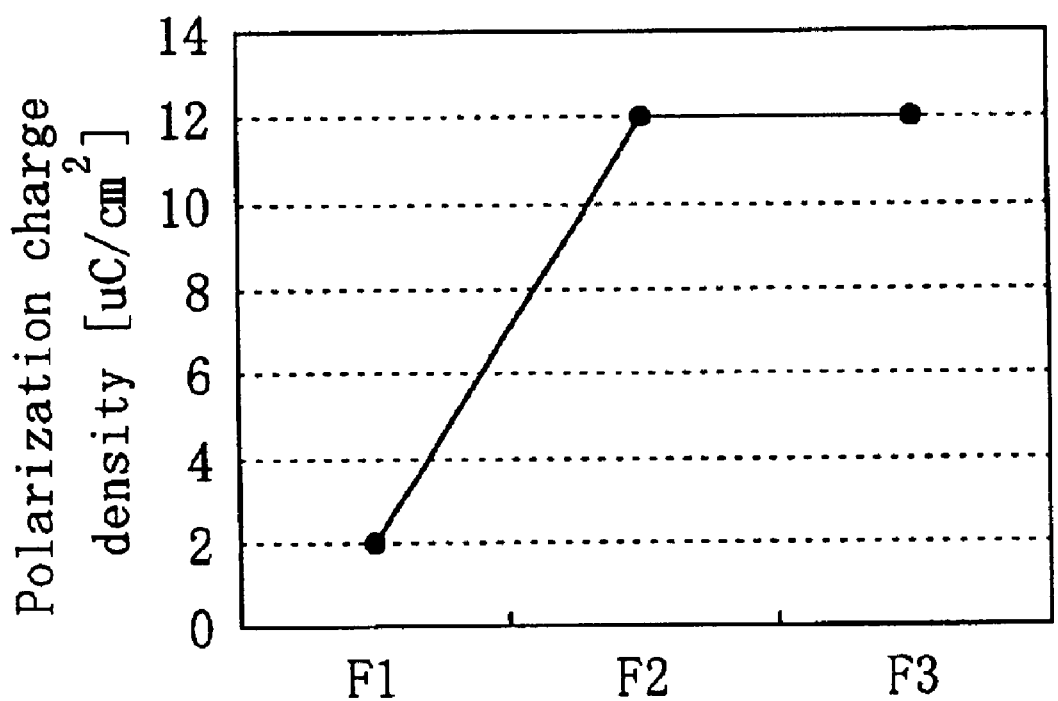
FIG. 3 is a graph illustrating a polarization characteristic of a memory cell capacitor provided in a memory cell of the present invention and that provided in a conventional memory cell.

FIG. 3 is a graph illustrating a polarization characteristic of a memory cell capacitor provided in the memory cell 100 of the present embodiment and that provided in the conventional memory cell 1000. In FIG. 3, "F1" denotes the polarization characteristic of the memory cell capacitor C after a hydrogen treatment for annealing is performed on the first conventional memory cell 1000 (which is not provided with the interlayer film 15), "F2" denotes the polarization characteristic of the memory cell capacitor C after a hydrogen treatment for annealing is performed on the memory cell 100 of the present embodiment (which is provided with the interlayer film 15), and "F3" denotes the polarization characteristic of the memory cell capacitor C before a hydrogen treatment for annealing is performed on the memory cell 100 of the present embodiment.

In the memory cell 100 of the present embodiment (which is provided with the step reducing interlayer film 15) the polarization charge density ($12\,\mu C/cm^2$) remains unchanged before (F3) and after (F2) a hydrogen treatment, as illustrated in. FIG. 3. In contrast, in the conventional memory cell 1000 (which is not provided with the step reducing interlayer film 15), the polarization charge density substantially decreases to $2\,\mu C/cm^2$ after a hydrogen treatment (F1).

Figure 18:
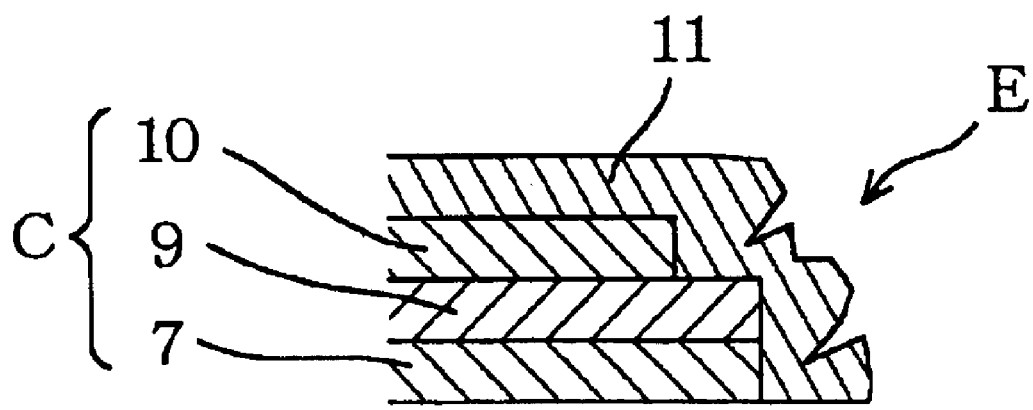

This is because in the conventional memory cell 1000, the second hydrogen barrier film 11 has a poor step coverage at the edge portion E of the memory cell capacitor C, as illustrated in FIG. 18. Due to the poor step coverage of the second hydrogen barrier film 11 at the edge portion E, the thickness thereof is reduced at the edge portion B. Moreover, the crystal condition of the second hydrogen barrier film 11 at the edge portion E is different from that in a flat portion, and the packing is also reduced. Therefore, the polarization characteristic of the memory cell capacitor C deteriorates due to intrusion and diffusion of hydrogen through the edge portion E.

In contrast, in the memory cell 100 of the present embodiment, the step reducing interlayer film 15 is provided so that the second hydrogen barrier film 11 has a hydrogen barrier property as good as that in the flat portion, thus improving the step coverage of the second hydrogen barrier film 11 at the edge portion e of the memory cell capacitor C. Therefore, deterioration of the polarization characteristic of the memory cell capacitor C due to intrusion and diffusion of hydrogen through the edge portion E is suppressed/prevented.

Next, a method for manufacturing the memory cell 100 of the present embodiment will be described with reference to FIG. 4A to FIG. 4C.

Figure 4A:
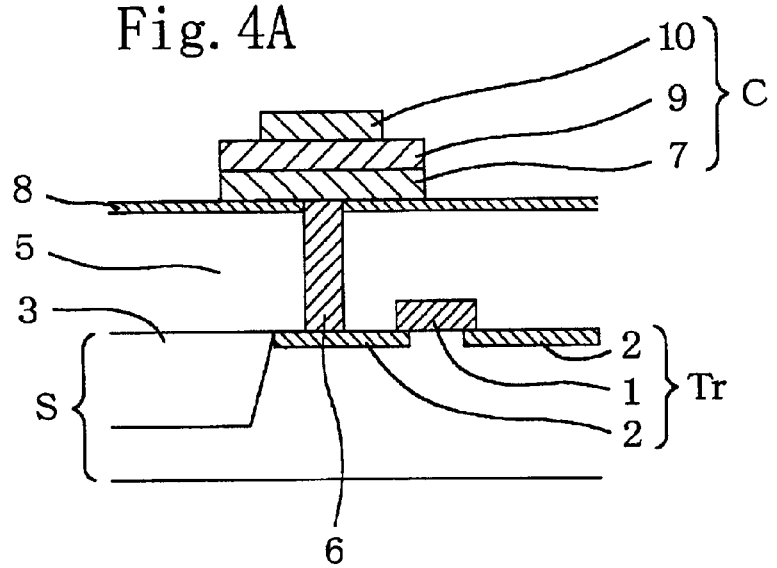
FIG. 4A, FIG. 4B and FIG. 4C are cross-sectional views illustrating a method for manufacturing a memory cell of Embodiment 1.

First, in the step of FIG. 4A, the STI region 3 is formed on the semiconductor substrate S, and then the MOS transistor Tr is formed. The MOS transistor Tr includes a gate insulating film (not shown) on the semiconductor substrate S, the gate electrode 1 on the gate insulating film, and the high concentration impurity diffusion regions 2 formed so as to interpose the gate electrode 1. Then, the first insulative film 5 and the first hydrogen barrier film 8 are deposited on the substrate in this order.

Then, a connection hole is provided so as to run through the first hydrogen barrier film 8 and the first insulative film 5 to reach one of the high concentration impurity diffusion regions 2, and the connection hole is filled with a tungsten film so as to form the contact plug 6. Then, the lower electrode 7, the capacitance insulating film 9 made of a ferroelectric material, and the upper electrode 10 are formed in this order by patterning the respective films so as to cover the contact plug 6. While the lower electrode 7 and the capacitance insulating film 9 are etched simultaneously in the present embodiment, they may alternatively be etched separately. While the upper electrode 10 of the memory cell capacitor C defines the capacitance in the present embodiment, the lower electrode 7 may alternatively define the capacitance.

Figure 4B:
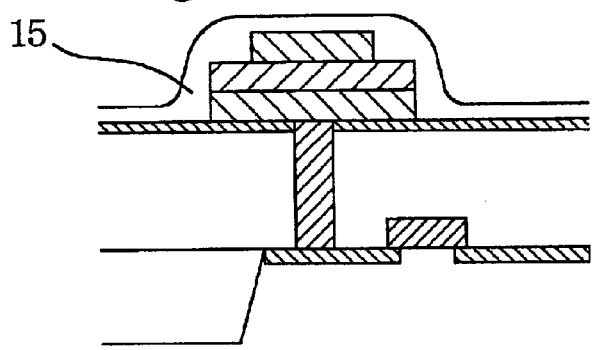

Then, in the step of FIG. 4B, the step reducing interlayer film 15 is formed on the substrate so as to cover the memory cell capacitor C. Specifically, in the present embodiment, the step reducing interlayer film 15 is formed by an atmospheric pressure thermal CVD method using $O_3$ and TEOS with a smooth surface configuration (hereinafter referred to as a "flow shape"). With this method, the temperature in the film formation step is as low as 400° C. while substantially no hydrogen is generated. Therefore, it is possible to form the step reducing interlayer film 15 without damaging the capacitance insulating film 9 made of a ferroelectric material. Moreover, if the interlayer film 15 is formed by an atmospheric pressure thermal CVD method using $O_3$ and TEOS, the surface of the interlayer film 15 naturally becomes smooth (this is called a "self flow phenomenon"). Thus, the smooth surface of the interlayer film 15 can be formed very easily. Therefore, it is most preferred to employ an atmospheric pressure thermal CVD method using $O_3$ and TEOS for the formation of the interlayer film 15. Alternatively, the interlayer film 15 can be formed by employing SOG (spin on glass), for example.

Figure 4C:
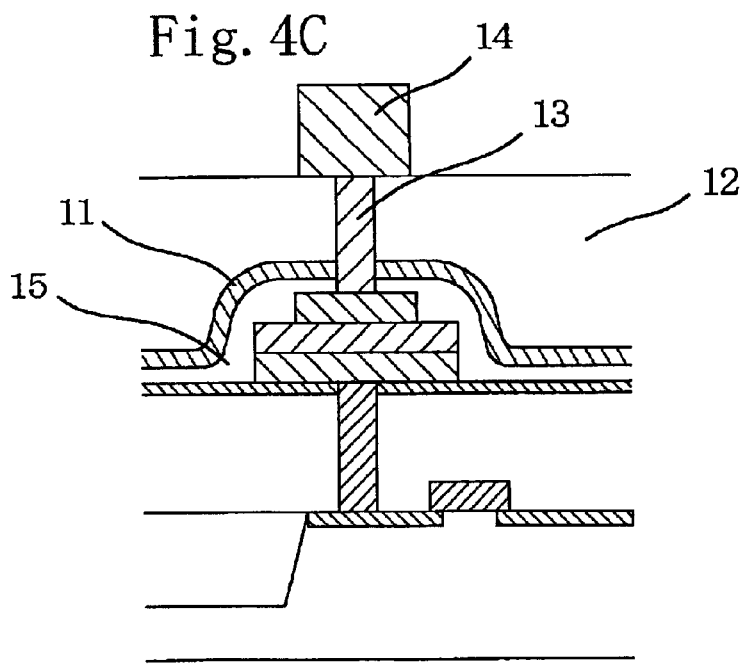

Then, in the step of FIG. 4C, the second hydrogen barrier film 11 is formed on the substrate to a thickness of about 50 nm by a sputtering method. In the present embodiment, the step reducing interlayer film 15 has been formed in the step of FIG. 4B as described above, so that the second hydrogen barrier film 11 can be formed by employing a sputtering method, which has a poorer step coverage than that of a CVD method. Since a sputtering method generates no hydrogen, it is possible to suppress/prevent deterioration due to hydrogen.

Then, the second insulative film 12 is deposited on the substrate, and flattened by a CMP method, or the like. Then, a connection hole is provided so as to run through the second insulative film 12, the second hydrogen barrier film 11 and the interlayer film 15 to reach the upper electrode 10, and the connection hole is filled with a tungsten film by a CVD method to form the contact plug 13. Then, the Al line 14 is formed so as to be connected to the contact plug 13.

Through these steps, it is possible to realize a reliable ferroelectric memory device in which deterioration of the capacitance insulating film due to hydrogen is suppressed/prevented.

In the present embodiment, the memory cell capacitor C employs a structure in which the upper electrode 10 defines the capacitance. Alternatively, the memory cell capacitor C may employ a structure in which the lower electrode 7 defines the capacitance. Thus, the hydrogen barrier effect of the second hydrogen barrier film 11 can be improved by providing the interlayer film 15 for reducing the step at the edge portion E of the memory cell capacitor C, irrespective of the structure of the memory cell capacitor C. Therefore, a ferroelectric memory device having a reliable memory cell is obtained.

Embodiment 2

Figure 5:
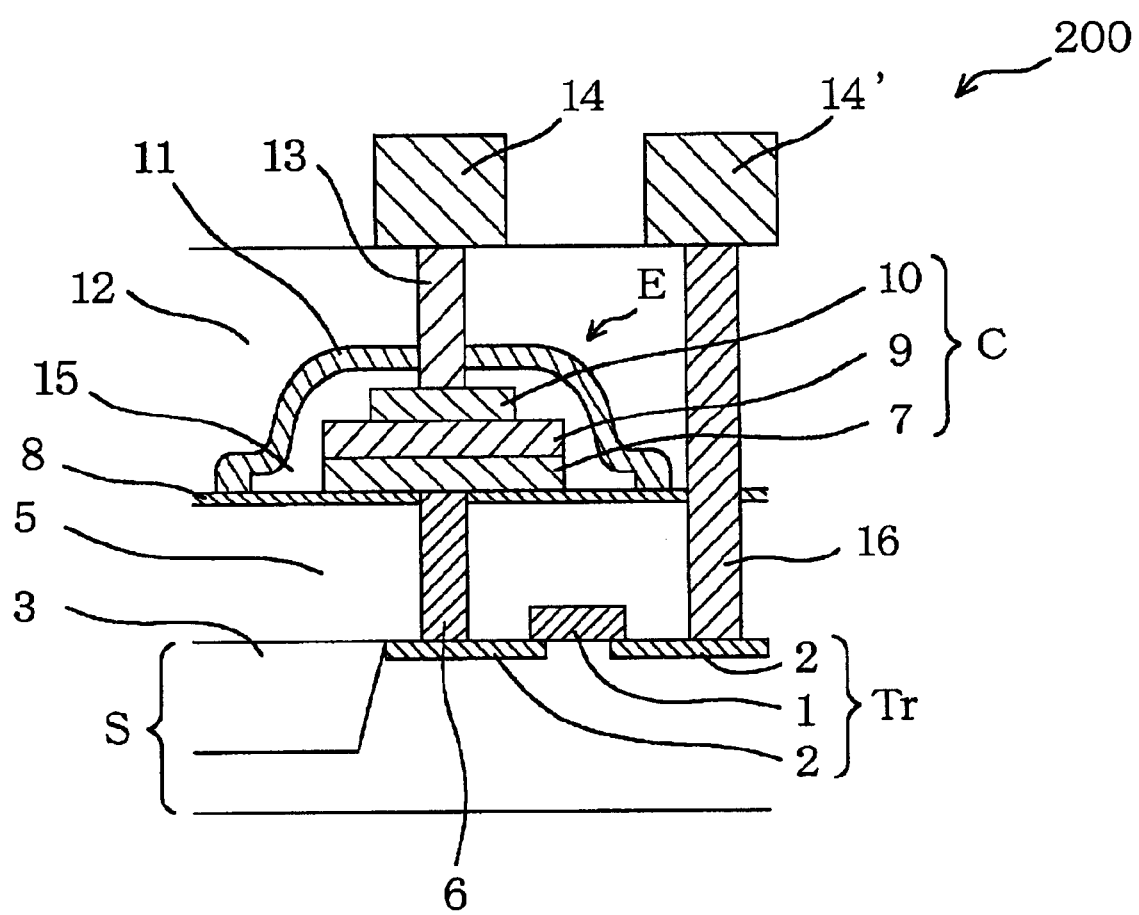
FIG. 5 is a cross-sectional view illustrating a memory cell including a memory cell capacitor of Embodiment 2.

FIG. 5 is a cross-sectional view illustrating a memory cell 200 including a memory cell capacitor of Embodiment 2.

The memory cell 200 of the present embodiment has substantially the same structure as that in Embodiment 1, except for the following differences.

First, instead of the bit line 4 of Embodiment 1, the memory cell 200 includes a contact plug 16 and an Al line 14', as illustrated in FIG. 5. The contact plug 16 is provided so as to run through the second insulative film 12, the first hydrogen barrier film 8 and the first insulative film 5 to reach the high concentration impurity diffusion region 2 of the MOS transistor Tr. The Al line 14' is connected to the contact plug 16 and functions as a bit line. Therefore, the step reducing interlayer film 15 and the second hydrogen barrier film 11 are not formed in the region where the contact plug 16 is provided.

Second, in the memory cell 200 of the present embodiment, the memory cell capacitor C and the interlayer film 15 are completely enclosed by the first hydrogen barrier film 8 and the second hydrogen barrier film 11, as illustrated in FIG. 5.

According to the present embodiment, the contact plug 16 does not run through the second hydrogen barrier film 11 and the interlayer film 15. Therefore, when forming the Al line 14', hydrogen will not pass from the contact plug 16 through the interlayer film 15 to intrude into the memory cell capacitor C. Thus, deterioration of the capacitance insulating film 9, which is made of a ferroelectric material, due to hydrogen can be suppressed/prevented more effectively.

Particularly, according to the present embodiment, the memory cell capacitor C and the interlayer film 15 are completely enclosed by the first hydrogen barrier film 8 and the second hydrogen barrier film 11, thereby improving the effect of suppressing/preventing deterioration of the characteristics of the capacitance insulating film due to hydrogen.

Next, three different methods for manufacturing the memory cell 200 of the present embodiment will be described with reference to FIG. 6A to FIG. 10B.

First Manufacturing Method

A first manufacturing method will be described with reference to FIG. 6A to FIG. 7B.

Figure 6A:
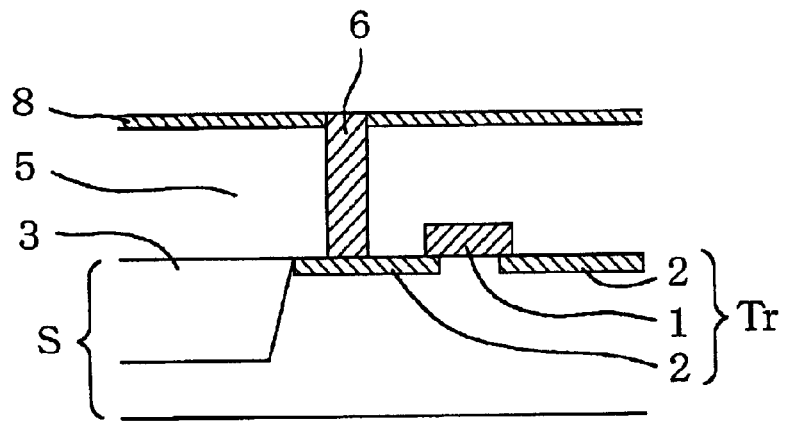
FIG. 6A, FIG. 6B and FIG. 6C are cross-sectional views illustrating a method for manufacturing a memory cell of Embodiment 2.

First, in the step of FIG. 6A, the STI region 3 is formed on the semiconductor substrate S, and then the MOS transistor Tr is formed. The MOS transistor Tr includes a gate insulating film (not shown) on the semiconductor substrate S, the gate electrode 1 on the gate insulating film, and the high concentration impurity diffusion regions 2 formed so as to interpose the gate electrode 1. Then, the first insulative film 5 and the first hydrogen barrier film 8 are deposited on the substrate in this order. Then, a connection hole is provided so as to run through the first hydrogen barrier film 8 and the first insulative film 5 to reach one of the high concentration impurity diffusion regions 2, and the connection hole is filled with a tungsten film to form the contact plug 6.

Figure 6B:
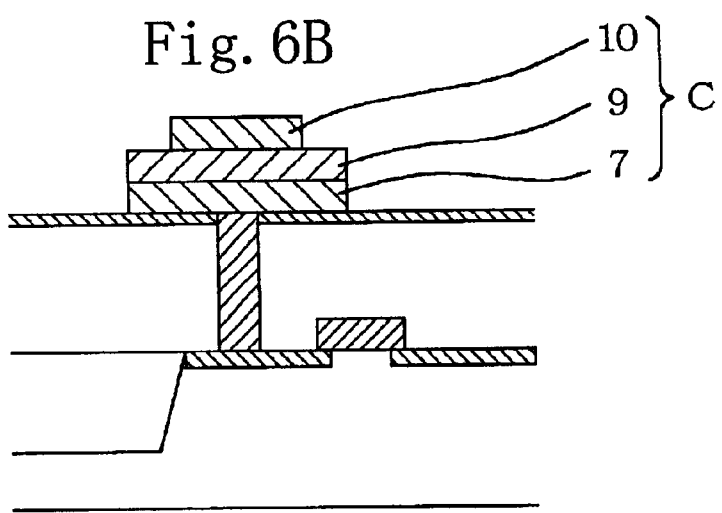

Then, in the step of FIG. 6B, the lower electrode 7, the capacitance insulating film 9 made of a ferroelectric material, and the upper electrode 10 are formed in this order by patterning the respective films so as to cover the contact plug 6. While the lower electrode 7 and the capacitance insulating film 9 are etched simultaneously in the present embodiment, they may alternatively be etched separately. While a memory cell capacitor structure in which the upper electrode 10 defines the capacitance is employed, another memory cell capacitor structure in which the lower electrode 7 defines the capacitance may alternatively be employed.

Figure 6C:
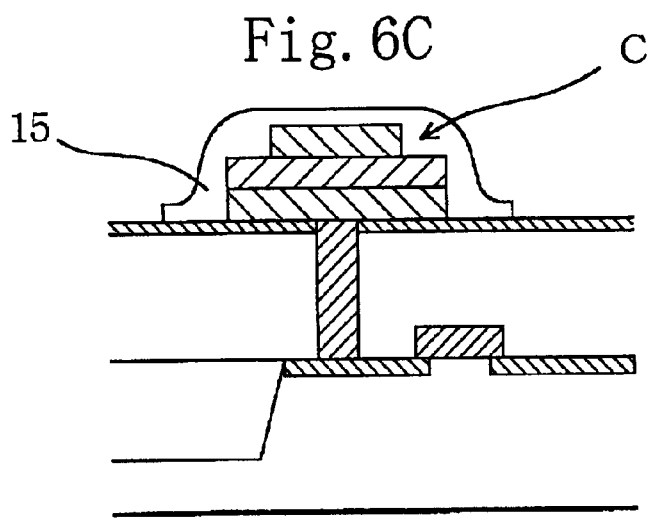

Then, in the step of FIG. 6C, the step reducing interlayer film 15 is formed on the substrate so as to cover the memory cell capacitor C, and then the interlayer film 15 is removed by dry etching from regions other than the region covering the memory cell capacitor C. Also in this manufacturing method, as in Embodiment 1 above, the step reducing interlayer film 15 is formed by an atmospheric pressure thermal CVD method using $O_3$ and TEOS with a good flow shape. In this way, it is possible to form the step reducing interlayer film 15 without damaging the capacitance insulating film 9 made of a ferroelectric material.

Also in this manufacturing method, the interlayer film 15 may be any film made of a material which is capable of reducing the step and which does not deteriorate a ferroelectric material. For example, TEOS, SOG (spin on glass), etc., may be used.

Figure 7A:
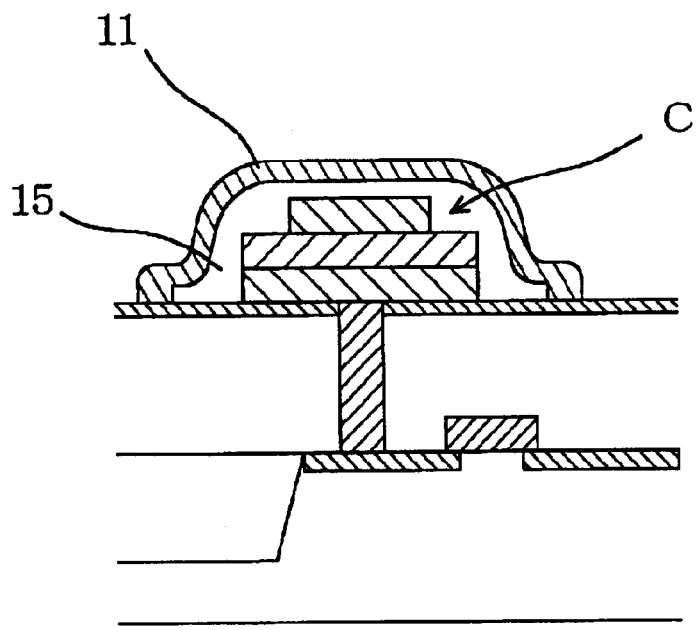
FIG. 7A and FIG. 7B are cross-sectional views illustrating a method for manufacturing a memory cell of Embodiment 2.

Then, in the step of FIG. 7A, the second hydrogen barrier film 11 is formed on the substrate to a thickness of about 50 nm. Then, the second hydrogen barrier film 11 is removed from regions other than the region covering the interlayer film 15. In this way, the memory cell capacitor C and the interlayer film 15 are completely enclosed by the first hydrogen barrier film 8 and the second hydrogen barrier film 11. In the present embodiment, the step reducing interlayer film 15 has been formed in the step of FIG. 6C as described above, so that the second hydrogen barrier film 11 can be formed by employing a sputtering method, which has a poorer step coverage than that of a CVD method. Thus, it is possible to suppress/prevent deterioration due to hydrogen, which is generated in a CVD method.

Figure 7B:
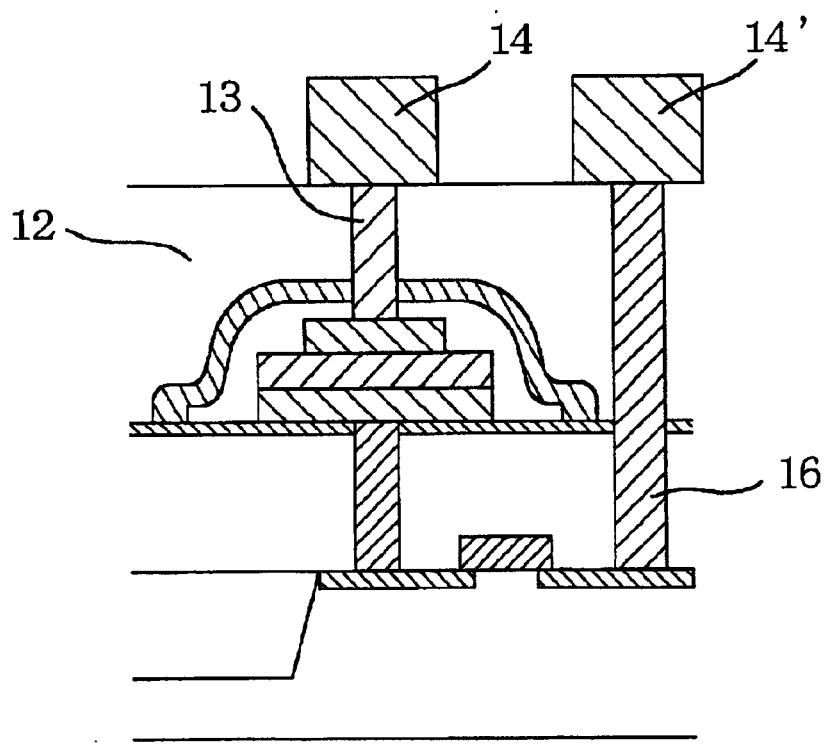

Then, in the step of FIG. 7B, the second insulative film 12 is deposited on the substrate, and flattened by a CMP method, or the like. Then, a connection hole is provided so as to run through the second insulative film 12, the second hydrogen barrier film 11 and the interlayer film 15 to reach the upper electrode 10, and the connection hole is filled with a tungsten film to form the contact plug 13. Then, a connection hole is provided so as to run through the second insulative film 12, the first hydrogen barrier film 8 and the first insulative film 5 to reach the high concentration impurity diffusion region 2 of the MOS transistor Tr, and the connection hole is filled with a tungsten film to form the contact plug 16.

Then, the Al line 14 and the Al line 14' are formed so as to be connected to the contact plugs 13 and 16, respectively.

Second Manufacturing Method

A second manufacturing method will be described with reference to FIG. 8A to FIG. 8D.

The second method for manufacturing the memory cell 200 of the present embodiment is substantially the same as the first manufacturing method above, except that the removal of the step reducing interlayer film 15 in the step of FIG. 6C in the first manufacturing method is performed by a wet etching method in the second manufacturing method.

Figure 8A:
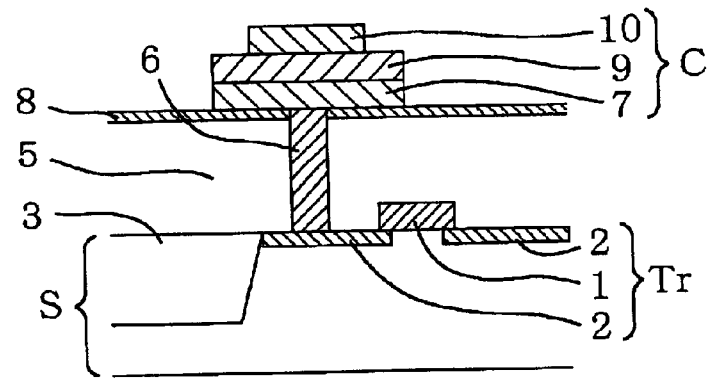
FIG. 8A, FIG. 8B, FIG. 8C and FIG. 8D are cross-sectional views illustrating a method for manufacturing a memory cell of Embodiment 2.

First, in the step of FIG. 8A, the STI region 3 is formed on the semiconductor substrate S, and then the MOS transistor Tr is formed. The MOS transistor Tr includes a gate insulating film (not shown) on the semiconductor substrate S, the gate electrode 1 on the gate insulating film, and the high concentration impurity diffusion regions 2 formed so as to interpose the gate electrode 1. Then, the first insulative film 5 and the first hydrogen barrier film 8 are deposited on the substrate in this order. Then, a connection hole is provided so as to run through the first hydrogen barrier film 8 and the first insulative film 5 to reach one of the high concentration impurity diffusion regions 2, and the connection hole is filled with a tungsten film to form the contact plug 6.

Then, the lower electrode 7, the capacitance insulating film 9 made of a ferroelectric material, and the upper electrode 10 are formed in this order by patterning the respective films so as to cover the contact plug 6. While the lower electrode 7 and the capacitance insulating film 9 are etched simultaneously in the present embodiment, they may alternatively be etched separately. While a memory cell capacitor structure in which the upper electrode 10 defines the capacitance is employed, another memory cell capacitor structure in which the lower electrode 7 defines the capacitance may alternatively be employed.

Figure 8B:
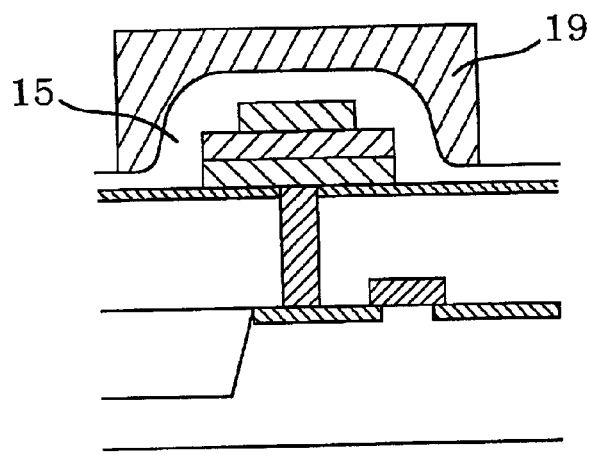

Then, in the step of FIG. 8B, the step reducing interlayer film 15 is formed on the substrate so as to cover the memory cell capacitor C, and then a resist mask 19 is formed by photolithography. Also in this manufacturing method, as in Embodiment 1 above, the step reducing interlayer film 15 is formed by an atmospheric pressure thermal CVD method using $O_3$ and TEOS with a good flow shape. In this way, it is possible to form the step reducing interlayer film 15 without damaging the capacitance insulating film 9 made of a ferroelectric material. Moreover, the interlayer film 15 may be any film made of a material (e.g., TEOS, SOG (spin on glass), etc.) which is capable of reducing the step and which does not deteriorate a ferroelectric material.

Figure 8C:
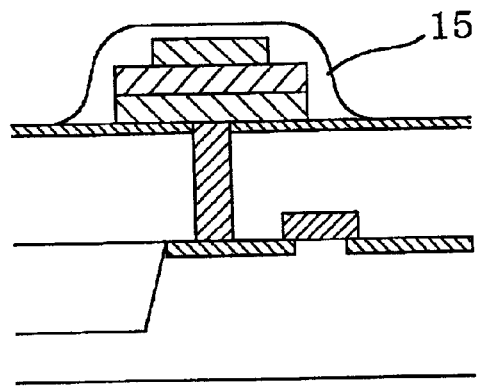

Then, in the step of FIG. 8C, an isotropic wet etching process (using hydrofluoric acid, or the like) is performed with the resist mask 19 as a mask until the surface of the first hydrogen barrier film 8 is exposed, thus patterning the interlayer film 15. In this way, it is possible to form the interlayer film 15 having a smoother surface than with the first manufacturing method above.

Figure 8D:
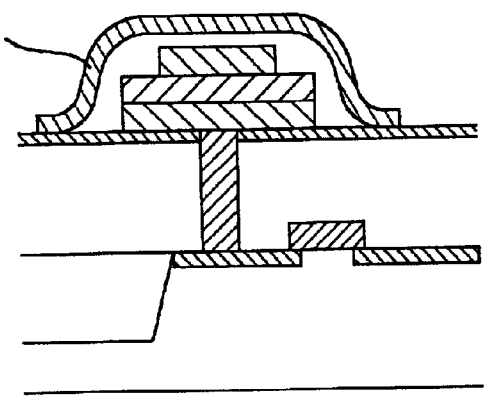

Then, in the step of FIG. 8D, the resist mask 19 is removed, and the second hydrogen barrier film 11 is formed on the substrate. The second hydrogen barrier film 11 is patterned so as to cover the step reducing interlayer film 15 and to contact the first hydrogen barrier film 8.

Then, as in the step of FIG. 7B in the first manufacturing method, the second insulative film 12 is deposited on the substrate, and flattened by a CMP method, or the like. Then, a connection hole is provided so as to run through the second insulative film 12, the second hydrogen barrier film 11 and the interlayer film 15 to reach the upper electrode 10, and the connection hole is filled with a tungsten film to form the contact plug 13. Then, a connection hole is provided so as to run through the second insulative film 12, the first hydrogen barrier film 8 and the first insulative film 5 to reach the high concentration impurity diffusion region 2 of the MOS transistor Tr, and the connection hole is filled with a tungsten film to form the contact plug 16.

Finally, the Al line 14 and the Al line 14' are formed so as to be connected to the contact plugs 13 and 16, respectively.

Third Manufacturing Method

A third manufacturing method will be described with reference to FIG. 9A to FIG. 10B.

Figure 9A:
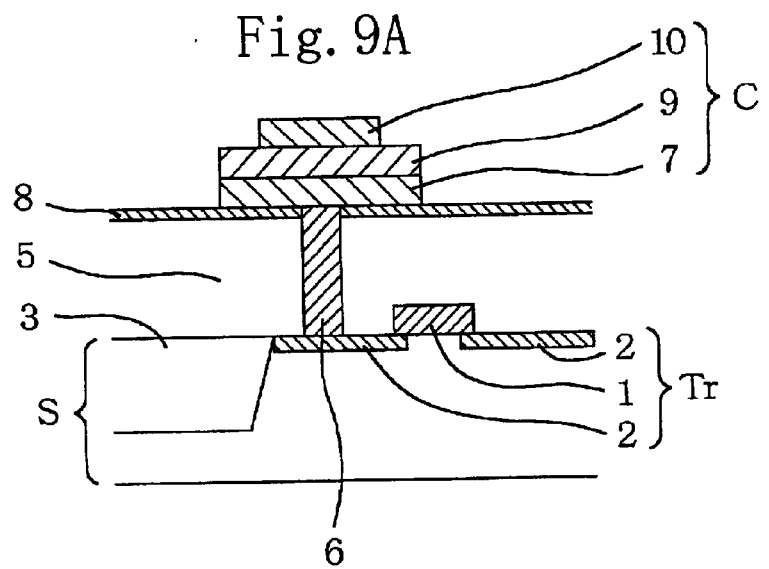
FIG. 9A, FIG. 9B and FIG. 9C are cross-sectional views illustrating a method for manufacturing a memory cell of Embodiment 2.

First, in the step of FIG. 9A, the STI region 3 is formed on the semiconductor substrate S, and then the MOS transistor Tr is formed. The MOS transistor Tr includes a gate insulating film (not shown) on the semiconductor substrate S, the gate electrode 1 on the gate insulating film, and the high concentration impurity diffusion regions 2 formed so as to interpose the gate electrode 1. Then, the first insulative film 5 and the first hydrogen barrier film 8 are deposited on the substrate in this order.

Then, a connection hole is provided so as to run through the first hydrogen barrier film 8 and the first insulative film 5 to reach one of the high concentration impurity diffusion regions 2, and the connection hole is filled with a tungsten film to form the contact plug 6. Then, the lower electrode 7, the capacitance insulating film 9 made of a ferroelectric material, and the upper electrode 10 are formed in this order by patterning the respective films so as to cover the contact plug 6. While the lower electrode 7 and the capacitance insulating film 9 are etched simultaneously in the present embodiment, they may alternatively be etched separately.

While a memory cell capacitor structure in which the upper electrode 10 defines the capacitance is employed, another memory cell capacitor structure in which the lower electrode 7 defines the capacitance may alternatively be employed.

Figure 9B:
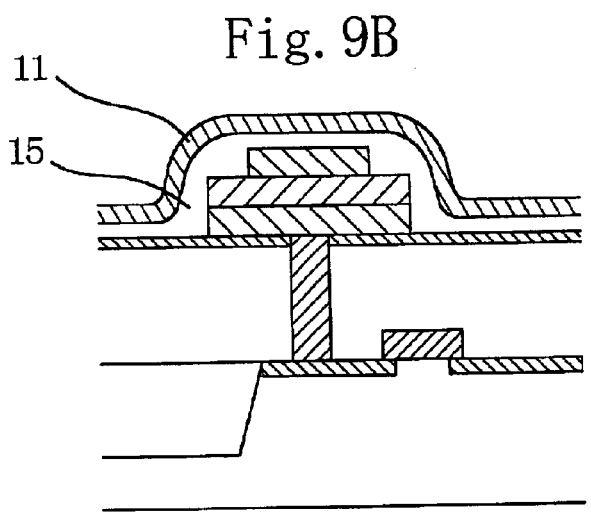

Then, in the step of FIG. 9B, the step reducing interlayer film 15 is formed on the substrate so as to cover the memory cell capacitor C. Specifically, in the present embodiment, the step reducing interlayer film 15 is formed by an atmospheric pressure thermal CVD method using $O_3$ and TEOS with a good flow shape. With this method, the temperature in the film formation step is as low as 400° C., and the amount of hydrogen to be generated is small. Therefore, it is possible to form the step reducing interlayer film 15 without damaging the capacitance insulating film 9 made of a ferroelectric material. The interlayer film 15 may be any film made of a material (e.g., SOG (spin on glass), etc.) which is capable of reducing the step and which does not deteriorate a ferroelectric material.

Then, the second hydrogen barrier film 11 is formed on the substrate to a thickness of about 50 nm. In the present embodiment, the step reducing interlayer film 15 has been formed, so that the second hydrogen barrier film 11 can be formed by employing a sputtering method, which has a poorer step coverage than that of a CVD method. Thus, it is possible to suppress/prevent deterioration due to hydrogen, which is generated in a CVD method.

Figure 9C:
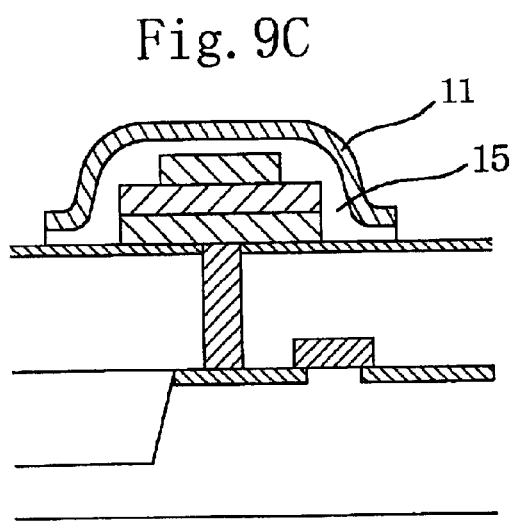

Then, in the step of FIG. 9C, a mask (not shown) is formed in a region covering the memory cell capacitor C, and a dry etching process using the mask is performed so as to remove the interlayer film 15 and the second hydrogen barrier film 11 from regions other than the region covering the memory cell capacitor C. Although not shown, the first hydrogen barrier film 8 may also be removed by a dry etching process using the same mask.

Figure 10A:
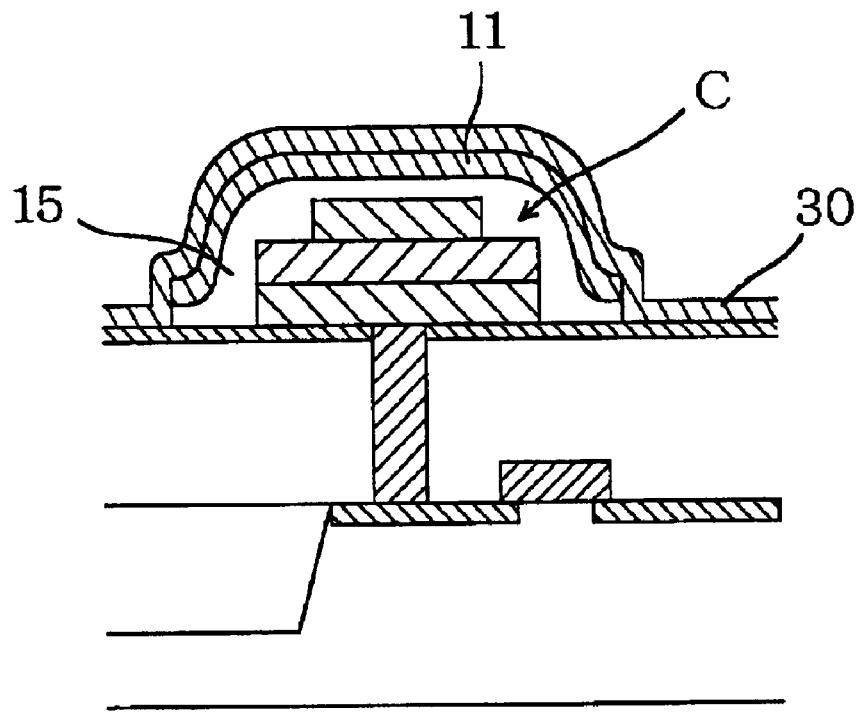
FIG. 10A and FIG. 10B are cross-sectional views illustrating a method for manufacturing a memory cell of Embodiment 2.

Then, in the step of FIG. 10A, a third hydrogen barrier film 30 is formed on the substrate to a thickness of about 50 nm.

Figure 10B:
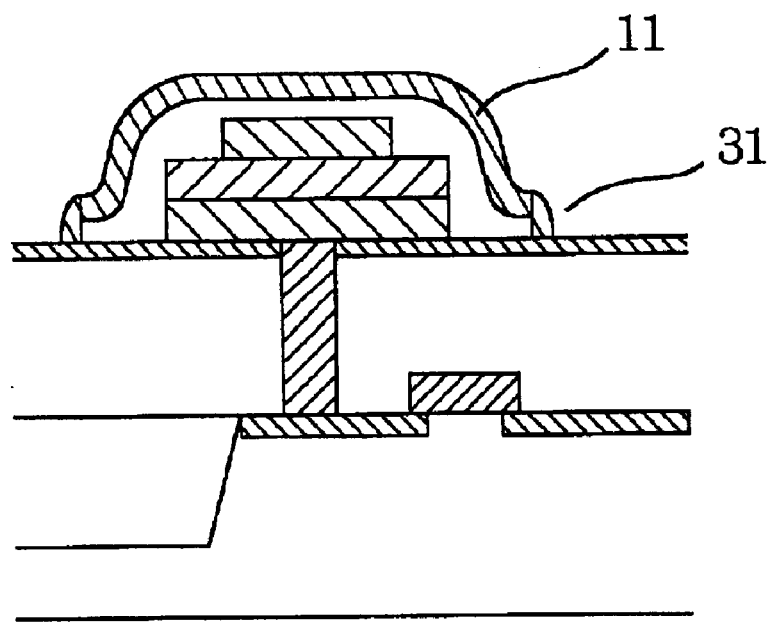

Then, in the step of FIG. 10B, the entire surface of the third hydrogen barrier film 30 is etched back to an extent such that the second hydrogen barrier film 11 having been formed in the step of FIG. 9C and covering the memory cell capacitor C will not be lost, so as to form a side wall 31 made of the third hydrogen barrier film 30.

Employing any of the three different manufacturing methods described above, it is possible to realize a ferroelectric memory device with the memory cell 200 of the present embodiment.

Embodiment 3

FIG. 11A to FIG. 11C are cross-sectional views illustrating a method for manufacturing a memory cell 300 including a memory cell capacitor of Embodiment 3.

The memory cell 300 of the present embodiment has substantially the same structure as that of Embodiment 2 above, except that the first hydrogen barrier film 8 is not formed in the region where the contact plug 16 is provided, as illustrated in FIG. 11C. Although not shown in FIG. 11C, the upper electrode 10 is provided in the form of a large cell plate that is connected at one end to an Al line.

The first hydrogen barrier film 8 is a hard nitride film made of SiN, SiON, or the like. Where a connection hole is formed to run through such a hard film, the connection hole is more likely to be deformed as the diameter of a portion of the connection hole that is running through the hard film is smaller. Moreover, as the aspect ratio of the connection hole is greater, it is more likely that the hard film cannot be threaded through (i.e., an "etching stop" phenomenon). Therefore, the shape of the contact plug 16 that fills the connection hole may be deteriorated.

However, in the memory cell 300 of the present embodiment, the contact plug 16 is formed so as to run through the first insulative film 5 and the second insulative film 12, and not through the first hydrogen barrier film 8 as in Embodiment 2 above. Thus, according to the present embodiment, it is possible to obtain a memory cell in which deterioration of the shape of the contact plug 16, which may occur when the contact plug 16 runs through the first hydrogen barrier film 8, is suppressed/prevented, in addition to effects as those of Embodiments 1 and 2.

Next, a method for manufacturing the memory cell 300 of the present embodiment will be described with reference to FIG. 11A to FIG. 11C.

First, the same steps as those of FIG. 6A to FIG. 6C in the first manufacturing method of Embodiment 2 are performed.

Then, in the step of FIG. 11A, the second hydrogen barrier film 11 is formed on the substrate to a thickness of about 50 nm. Also in the present embodiment, the step reducing interlayer film 15 has been formed in the step of FIG. 6C as described above, so that the second hydrogen barrier film 11 can be formed by employing a sputtering method, which has a poorer step coverage than that of a CVD method. Thus, it is possible to suppress/prevent deterioration due to hydrogen, which is generated in a CVD method.

Then, in the step of FIG. 11D, the second hydrogen barrier film 11 and the underlying first hydrogen barrier film 8 are removed by a dry etching process using the same mask from regions outside the region in which the interlayer film 15 is covered by the second hydrogen barrier film 11.

Then, in the step of FIG. 11C, the second insulative film 12 is deposited on the substrate, and flattened by a CMP method, or the like. Then, a connection hole is provided so as to run through the second insulative film 12 and first insulative film 5 to reach the high concentration impurity diffusion region 2 of the MOS transistor Tr, and the connection hole is filled with a tungsten film. to form the contact plug 16.

Then, the Al line 14' is formed so as to be connected to the contact plug 16.

With the manufacturing method of the present embodiment, the first hydrogen barrier film is removed from the region where the contact plug 16 is formed, whereby it is possible to suppress/prevent deterioration of the shape of the contact plug, which may otherwise occur due to the interlayer film 15 and the first hydrogen barrier film layered together.

Embodiment 4

Figure 12:
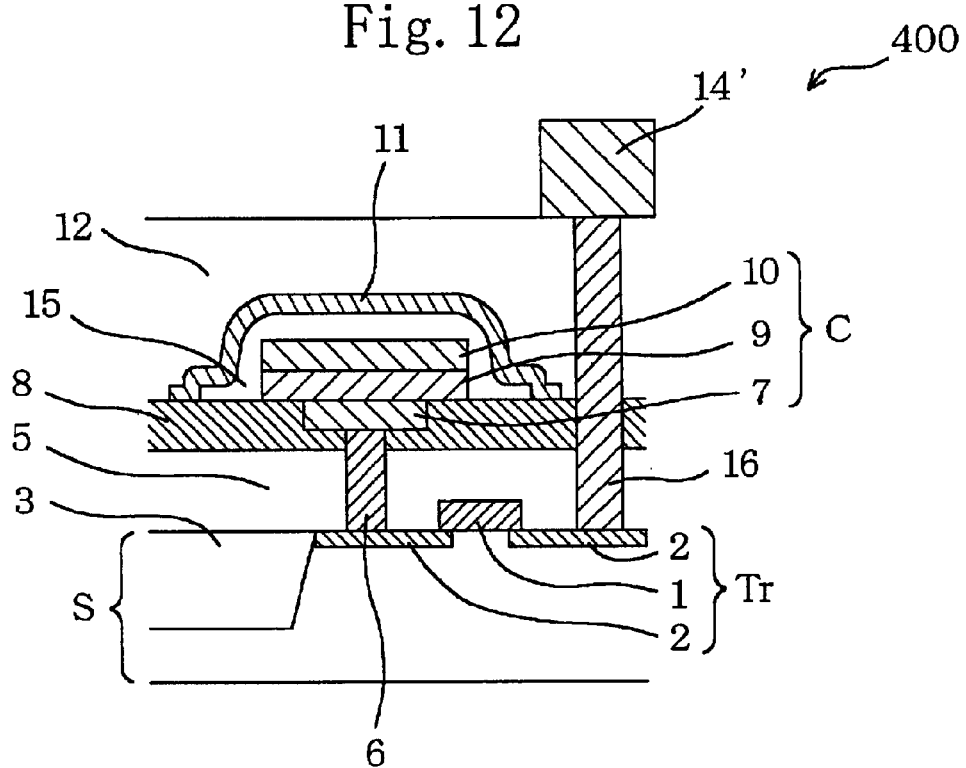
FIG. 12 is a cross-sectional view illustrating a memory cell including a memory cell capacitor of Embodiment 4.
Figure 13:
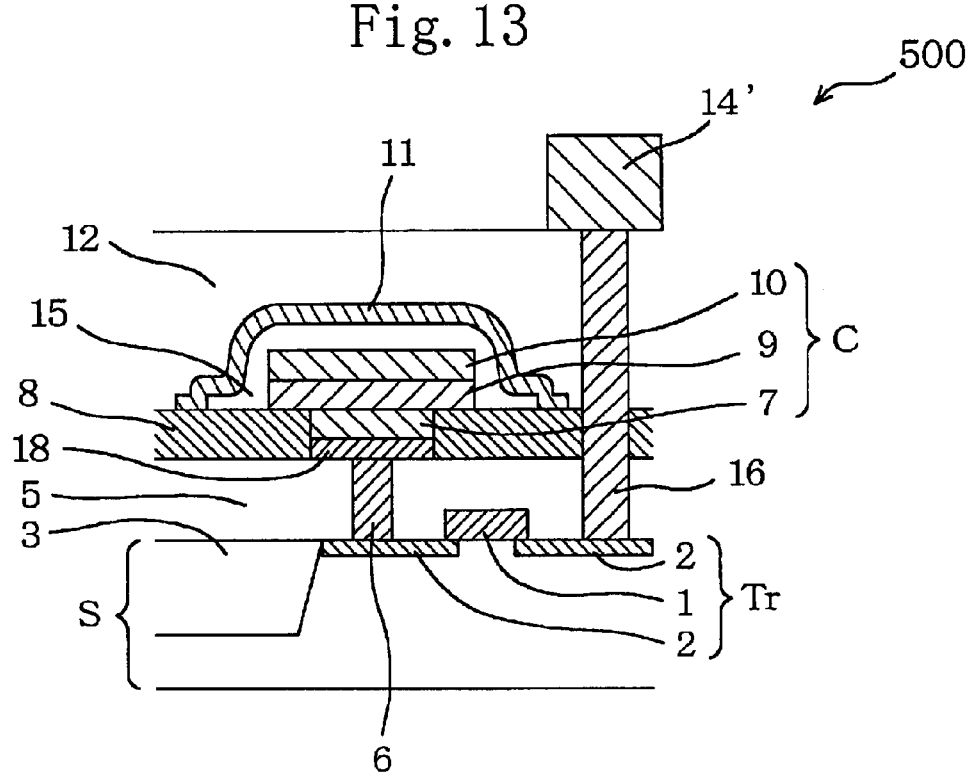
FIG. 13 is a cross-sectional view illustrating a memory cell including a memory.cell capacitor of Embodiment 4.

FIG. 12 and FIG. 13 are cross-sectional views each illustrating a memory cell including a memory cell capacitor of Embodiment 4.

As illustrated in FIG. 12, a memory cell 400 of the present embodiment includes the MOS transistor Tr used as a memory cell transistor, and the memory cell capacitor C.

The MOS transistor Tr includes the gate electrode 1 formed on the semiconductor substrate S, and the high concentration impurity diffusion regions 2 formed on the. semiconductor substrate S. The MOS transistor Tr of a memory cell is electrically isolated from the MOS transistor Tr of another adjacent memory cell by the STI region 3. A word line (not shown) is connected to the gate electrode 1, and the Al line 14' is connected to one of the high concentration impurity diffusion regions 2 via the contact plug 16 and functions as a bit line. The first insulative film 5 and the first hydrogen barrier film 8 are formed on the semiconductor substrate S with the MOS transistor Tr formed thereon. The first hydrogen barrier film 8 is provided for suppressing/preventing intrusion and diffusion of hydrogen therethrough from the semiconductor substrate S side.

The memory cell capacitor C includes the lower electrode 7 buried in the first hydrogen barrier film 8, the capacitance insulating film 9 made of a ferroelectric material and formed on the lower electrode 7, and an upper electrode 10 formed on the capacitance insulating film 9. The lower electrode 7 is connected to the other one of the high concentration impurity diffusion regions 2 via the contact plug 6 running through the first insulative film 5 and the first hydrogen barrier film 8.

The interlayer film 15 for reducing the step at the edge portion E of the memory cell capacitor C is formed on the first hydrogen barrier film 8 and the memory cell capacitor C so as to cover the upper surface and the side surface of the memory cell capacitor C. The interlayer film 15 is provided only in the region covering the memory cell capacitor C. The second hydrogen barrier film 11 is formed on the interlayer film 15 so as to cover the interlayer film 15 and to contact the first hydrogen barrier film 8. Thus, the memory cell capacitor C and the interlayer film 15 are completely enclosed by the first hydrogen barrier film 8 and the second hydrogen barrier film 11.

Moreover, the second insulative film 12 is formed on the second hydrogen barrier film 11. Although not shown in FIG. 12, the upper electrode 10 is provided in the form of a large cell plate that is connected at one end to an Al line.

In the present embodiment, the interlayer film 15 for reducing the step at the edge portion E of the memory cell capacitor C is formed so as to cover the memory cell capacitor C. Thus, the step coverage of the second hydrogen barrier film 11 is improved. Therefore, as in Embodiment 1 above, the crystallinity/packing of the second hydrogen barrier film 11 formed on the interlayer film 15 is maintained at the edge portion E, as compared to the conventional memory cell 1000.

With this structure, the lower electrode 7 is buried, whereby it is possible to reduce the height of the memory cell capacitor C from the surface of the first hydrogen barrier film 8 by the thickness of the lower electrode 7, in addition to the effects set forth in Embodiment 2. Thus, the step in the second hydrogen barrier film 11 is reduced. Therefore, it is possible to suppress the influence of the thickness of the resist film used when patterning the second hydrogen barrier film 11 on the patterning process, thereby further miniaturizing the memory cell.

While a memory cell capacitor structure in which the lower electrode 7 defines the capacitance is employed in the present embodiment, another memory cell capacitor structure in which the upper electrode 10 defines the capacitance may alternatively be employed.

In the present embodiment, it is preferred to provide a conductive hydrogen barrier film 18 immediately under the lower electrode 7, as illustrated in FIG. 13.

In this way, it is possible to suppress/prevent deterioration of the characteristics of the capacitance insulating film due to a very slight amount of hydrogen that is diffused from the contact plug 6, in addition to the effects described above.

Next, a method for manufacturing a memory cell 500 of the present embodiment will be described with reference to FIG. 14A to FIG. 15B.

Figure 14A:
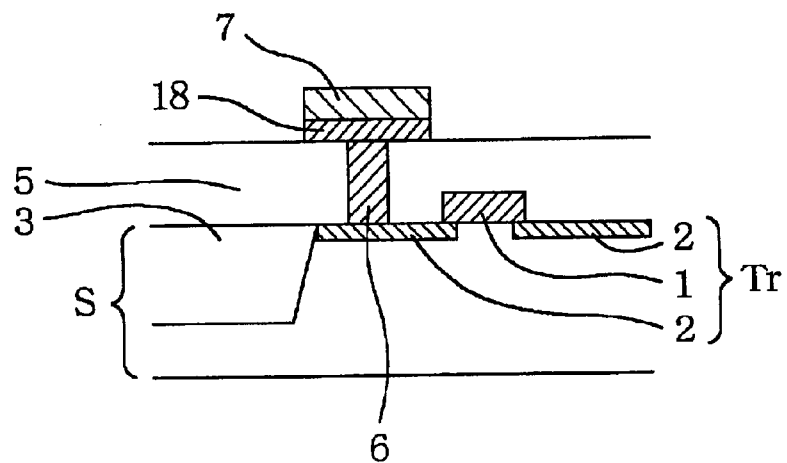
FIG. 14A, FIG. 14B and FIG. 14C are cross-sectional views illustrating a method for manufacturing a memory cell of Embodiment 4.

First, in the step of FIG. 14A, the STI region 3 is formed on the semiconductor substrate S, and then the MOS transistor Tr is formed. The MOS transistor Tr includes a gate insulating film (not shown) on the semiconductor substrate S, the gate electrode 1 on the gate insulating film, and the high concentration impurity diffusion regions 2 formed so as to interpose the gate electrode 1. Then, the first insulative film 5 is deposited on the substrate. Then, a connection hole is provided so as to run through the first insulative film 5 to reach one of the high concentration impurity diffusion regions 2, and the connection hole is filled with a tungsten film to form the contact plug 6. Then, a conductive hydrogen barrier material and a metal material are sequentially deposited and patterned so as to cover the contact plug 6, thereby forming the conductive hydrogen barrier film 18 and the lower electrode 7.

Figure 14B:
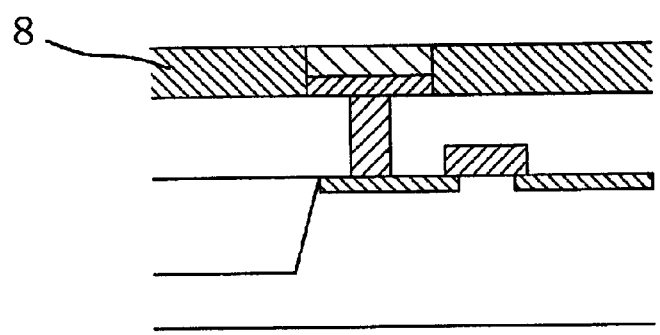

Then, in the step of FIG. 14B, the first hydrogen barrier film 8 is formed on the substrate, and flattened by a CMP method, or the like, so that the surface of the lower electrode 7 is exposed.

Figure 14C:
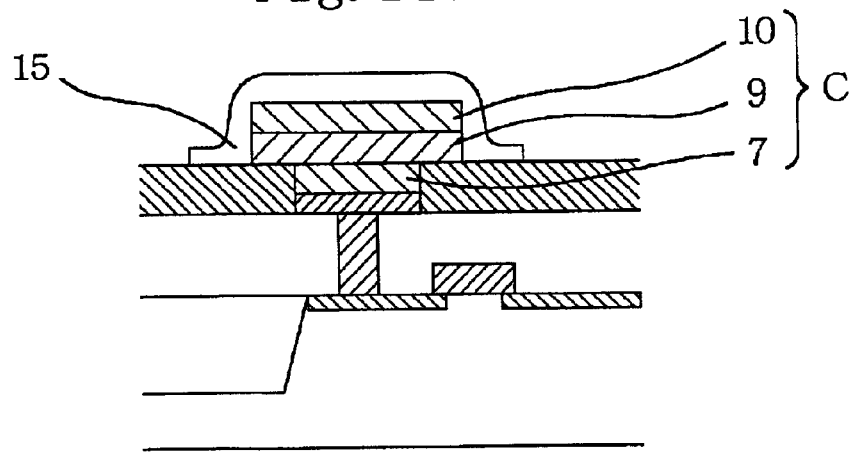

Then, in the step of FIG. 14C, a ferroelectric material and a metal material are deposited on the substrate, and then subjected to photolithography and dry etching. In this way, the capacitance insulating film 9 and the upper electrode 10 are formed so as to cover the lower electrode 7, thus forming the memory cell capacitor C. While the capacitance insulating film 9 and the upper electrode 10 are patterned simultaneously in the present embodiment, they may alternatively be patterned separately. Then, the step reducing interlayer film 15 is deposited on the substrate, and then subjected to photolithography and dry etching to form the step reducing interlayer film 15 so as to cover the memory cell capacitor C.

Figure 15A:
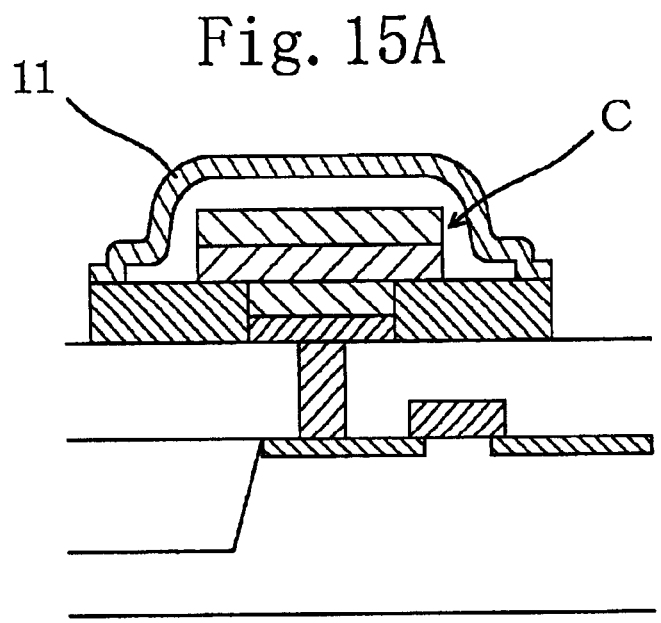
FIG. 15A and FIG. 15B are cross-sectional views illustrating a method for manufacturing a memory cell of Embodiment 4.

Then, in the step of FIG. 15A, the second hydrogen barrier film 11 is formed on the substrate to a thickness of about 50 nm. The step reducing interlayer film 15 has been formed in the step of FIG. 14C as described above, so that the second hydrogen barrier film 11 can be formed by employing a sputtering method, which has a poorer step coverage than that of a CVD method. Thus, it is possible to suppress/prevent deterioration due to hydrogen, which is generated in a CVD method.

Then, the second hydrogen barrier film 11 and the underlying first hydrogen barrier film 8 are removed by photolithography and dry etching from regions outside the region in which the interlayer film 15 is covered by the second hydrogen barrier film 11.

Figure 15B:
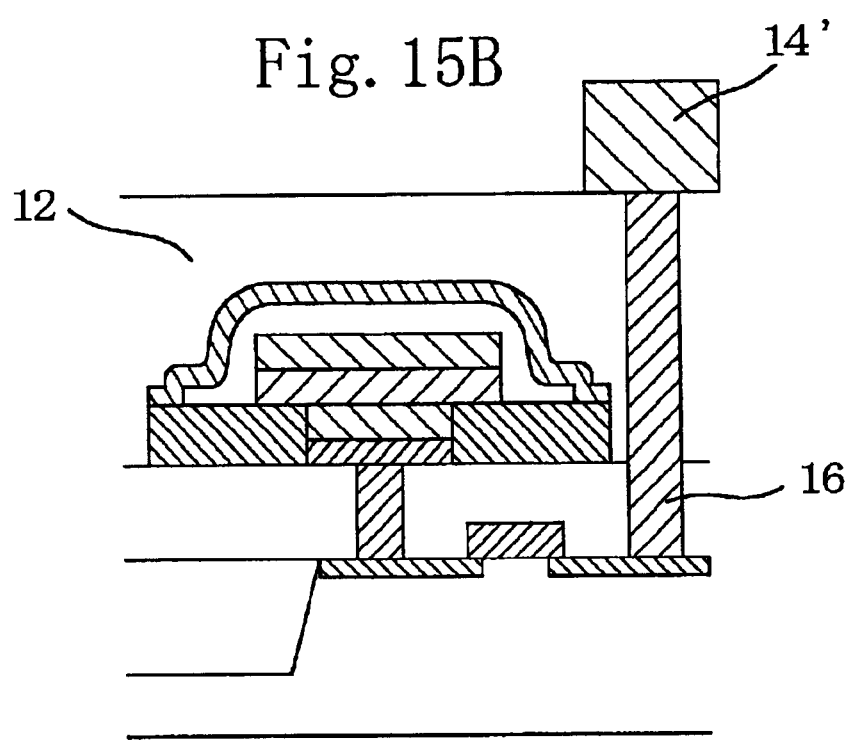
Figure 16:
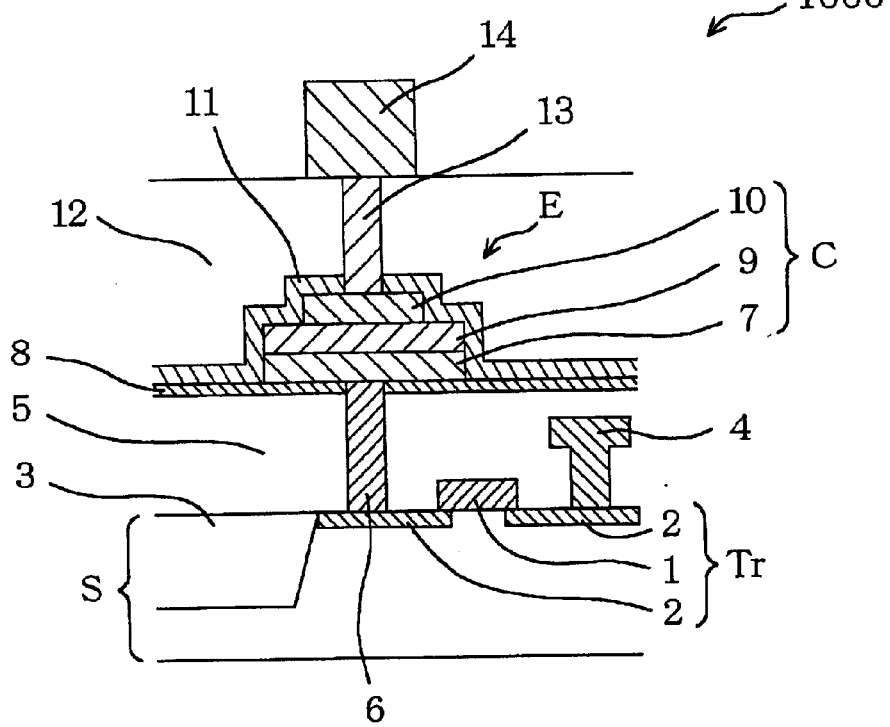
FIG. 16 is a cross-sectional view illustrating a conventional memory cell.
Figure 17:
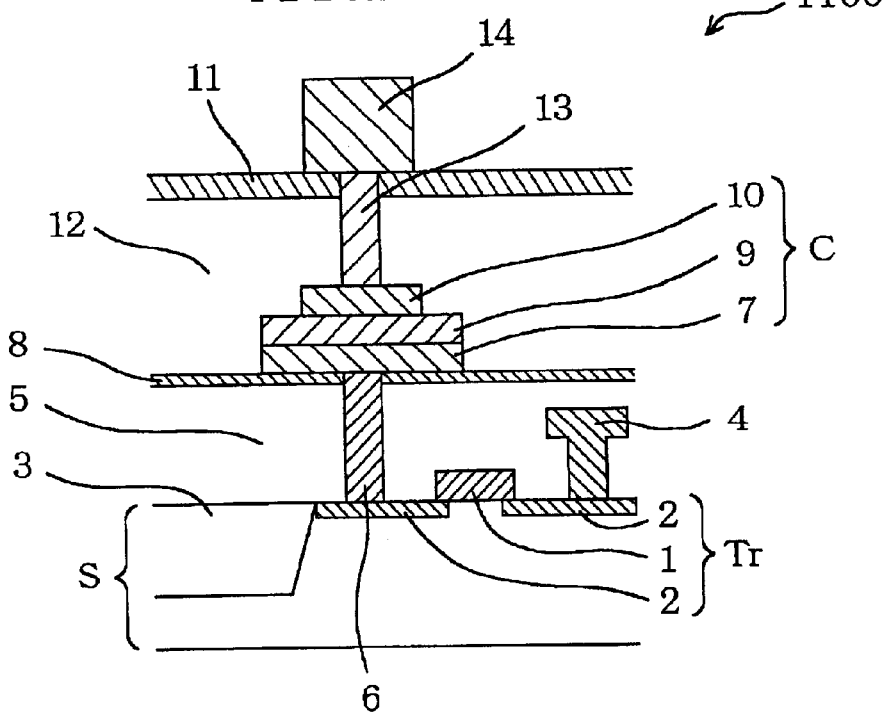
FIG. 17 is a cross-sectional view illustrating a conventional memory cell.

Then, in the step of FIG. 15B, the second insulative film 12 is deposited on the substrate, and flattened by a CMP method, or the like. Then, a connection hole is provided so as to run through the second insulative film 12, the second hydrogen barrier film 11 and the interlayer film 15 to reach the upper electrode 10, and the connection hole is filled with a tungsten film to form the contact plug 13. Then, a connection hole is provided so as to run through the second insulative film 12 and the first insulative film 5 to reach the high concentration impurity diffusion region 2 of the MOS transistor Tr, and the connection hole is filled with a tungsten film to form the contact plug 16.

Then, the Al line 14' is formed so as to be connected to the contact plug 16, thus obtaining the memory cell 500 of the present embodiment.

A method for manufacturing the memory cell 500 of the present embodiment has been described above. The memory cell 400 of the present embodiment can be manufactured by modifying the step of FIG. 14A so that the conductive hydrogen barrier material for forming the conductive hydrogen barrier film 18 is not deposited in the step.

While a manufacturing method in which the lower electrode 7 defines the capacitance is employed, another manufacturing method in which the upper electrode 10 defines the capacitance may alternatively be employed.

While the lower electrode 7 is connected to the high concentration impurity diffusion region 2 of the MOS transistor Tr via a line in Embodiments 1 to 4 above, the present invention can also be applied to a structure where the lower electrode 7 is provided in the form of a large cell plate and the upper electrode 10 is connected to the high concentration impurity diffusion region 2 of the MOS transistor Tr via a line.

The capacitance insulating film 9 is made of a ferroelectric material in Embodiments 1 to 4 above. Alternatively, the capacitance insulating film 9 may be made of a high-dielectric-constant material, in which case an effect of suppressing/preventing deterioration of the characteristics of the high-dielectric-constant material is similarly provided. Specifically, the material of the capacitance insulating film 9 may be a single layer film such as a strontium titanate film, a barium-added strontium titanate film, an $SrBi_2Ta_2O_9$ film, a film of an oxide containing lead, zirconium and titanium (PZT), or a film of an oxide containing lead, lanthanum, zirconium and titanium (PLZT), a layered film of a tantalum oxide film and a silicon oxide film, or the like.

In Embodiments 1 to 4 above, the gate electrode 1 may be a layered film obtained by depositing a polysilicon film containing substantially no impurities, implanting impurity ion, and then depositing a tungsten film, a molybdenum film, a titanium film, a platinum film, a tungsten silicide film, a molybdenum silicide film, a titanium silicide film, a platinum silicide film, or the like. Alternatively, the gate electrode 1 may be obtained, without performing the impurity ion implantation, by depositing a single-layer film such as a tungsten film, a molybdenum film, a titanium film, a platinum film, a tungsten silicide film, a molybdenum silicide film, a titanium silicide film, a platinum silicide film, or the like.

In Embodiments 1 to 4 above, the contact plugs 6 and 13 are formed from a tungsten film. Alternatively, the contact plugs 6 and 13 may be formed from a layered film of a tungsten film, a TiN film and a Ti film.

In Embodiments 1 to 4 above, the lower electrode 7 and the upper electrode 10 are each provided in the form of a layered film including a Pt film, an Ir film and a TiN film in this order, with the Pt film being in contact with the capacitance insulating film 9. Alternatively, the Ir film may be replaced by an $IrO_2$ film, and the TiN film may be replaced by a Ti film.

The material of each of the first hydrogen barrier film 8 and the second hydrogen barrier film 11 may be any material having a hydrogen barrier property (e.g., $Al_2O_3$, TiN, TiAlN, TiSiN, TaN, TaAlN, or TaSiN).

According to the present invention, it is possible to obtain a ferroelectric memory device including a reliable memory cell capacitor in which deterioration of the characteristics of the memory cell capacitor due to hydrogen or a reducing atmosphere is suppressed/prevented.

What is claimed is:

1. A semiconductor memory device, comprising:
   a semiconductor having an insulative film in an upper portion of the semiconductor substrate;
   a contact plug running through the insulative film;
   a memory cell capacitor for storing data, including a first electrode provided above the semiconductor substrate and connected to the contact plug, a capacitance insulating film formed on the first electrode, and a second electrode provided on the capacitance insulating film;
   a step reducing film covering an upper surface and a side surface of the memory cell capacitor; and
   an overlying hydrogen barrier film covering the step reducing film.

2. The semiconductor memory device of claim 1, wherein the step reducing film is formed by an atmospheric pressure thermal CVD method using $O_3$ and TEOS.

3. The semiconductor memory device of claim 1, wherein the overlying hydrogen barrier film is formed by a sputtering method.

4. The semiconductor memory device of claim 1, further comprising an underlying hydrogen barrier film provided under the first electrode.

5. The semiconductor memory device of claim 4, wherein the underlying hydrogen barrier film is in contact with the overlying hydrogen barrier film in a peripheral region around the memory cell capacitor.

6. The semiconductor memory device of claim 5, wherein the overlying hydrogen barrier film and the underlying hydrogen barrier film are patterned so as to have substantially the same outer shape.

7. The semiconductor memory device of claim 5, wherein the overlying hydrogen barrier film includes a barrier film covering an upper of the step reducing film and a side wall covering a side surface of the step reducing film.

8. The semiconductor memory device of claim 4, wherein the first electrode is buried in the underlying hydrogen barrier film.

9. The semiconductor memory device of claim 8, wherein the first electrode includes a conductive hydrogen barrier film in a lower portion thereof.

10. A semiconductor memory device, comprising:
    a semiconductor substrate;
    a memory cell capacitor for storing data, including a first electrode provided above the semiconductor substrate, a capacitance insulating film formed on the first electrode, and a second electrode provided on the capacitance insulating film;
    a step reducing film covering an upper surface and a side surface of the memory cell capacitor; and
    an overlying hydrogen barrier film covering the step reducing film,
    wherein the overlying hydrogen barrier film is made of $Al_2O_3$, TiN, TiAlN, TiSiN, TaN, TaAlN, or TaSiN.

11. A semiconductor memory device, comprising:
    a semiconductor substrate;
    a memory cell capacitor for storing data, including a first electrode provided above the semiconductor substrate, a capacitance insulating film formed on the first electrode, and a second electrode provided on the capacitance insulating film;
    a step reducing film covering an upper surface and a side surface of the memory cell capacitor; and
    an overlying hydrogen barrier film covering the step reducing film,
    wherein the overlying hydrogen barrier film is formed by a sputtering method.

12. A semiconductor memory device, comprising:
    a semiconductor substrate;
    a memory cell capacitor for storing data, including a first electrode provided above the semiconductor substrate, a capacitance insulating film formed on the first electrode, and a second electrode provided an the capacitance insulating film;
    a step reducing film covering an upper surface and a side surface of the memory cell capacitor;
    an overlying hydrogen barrier film covering the step reducing film, and
    an underlying hydrogen barrier film provided under the first electrode,
    wherein the underlying hydrogen barrier film is in contact with the overlying hydrogen barrier film in a peripheral region around the memory cell capacitor, and a contact portion between the underlying hydrogen barrier film and the overlying hydrogen barrier film is apart from the memory cell capacitor.

13. A semiconductor memory device, comprising:

a semiconductor substrate;

a memory cell capacitor for storing data, including a first electrode provided above the semiconductor substrate, a capacitance insulating film formed on the first electrode, and a second electrode provided on the capacitance insulating film;

a step reducing film covering an upper surface and a side surface of the memory cell capacitor;

an overlying hydrogen barrier film covering the step reducing film, and an underlying hydrogen barrier film provided under the first electrode, wherein the first electrode is buried in the underlying hydrogen barrier film, and the capacitance insulating film is in contact with the underlying hydrogen barrier film.

* * * * *